United States Patent
Yamazaki et al.

(10) Patent No.: US 10,461,538 B2
(45) Date of Patent: Oct. 29, 2019

(54) SYSTEM STABILIZATION CONTROL DEVICE AND POWER SYSTEM CONTROL SYSTEM

(71) Applicant: HITACHI, LTD., Tokyo (JP)

(72) Inventors: Jun Yamazaki, Tokyo (JP); Osamu Tomobe, Tokyo (JP); Eisuke Kuroda, Tokyo (JP); Akira Tsubota, Tokyo (JP); Sumito Tobe, Tokyo (JP); Masahiro Yatsu, Tokyo (JP)

(73) Assignee: HITACHI, LTD., Tokyo (JP)

( * ) Notice: Subject to any disclaimer, the term of this patent is extended or adjusted under 35 U.S.C. 154(b) by 179 days.

(21) Appl. No.: 15/555,571

(22) PCT Filed: Mar. 4, 2016

(86) PCT No.: PCT/JP2016/056699
§ 371 (c)(1),
(2) Date: Sep. 5, 2017

(87) PCT Pub. No.: WO2016/158198
PCT Pub. Date: Oct. 6, 2016

(65) Prior Publication Data
US 2018/0054059 A1 Feb. 22, 2018

(30) Foreign Application Priority Data
Mar. 30, 2015 (JP) .................. 2015-068757

(51) Int. Cl.
*H02J 3/24* (2006.01)
*H02J 13/00* (2006.01)
(Continued)

(52) U.S. Cl.
CPC ............... *H02J 3/24* (2013.01); *G01R 31/40* (2013.01); *G05B 9/02* (2013.01); *H02J 13/00* (2013.01);
(Continued)

(58) Field of Classification Search
CPC .. G01R 31/40; G05B 9/02; H02J 13/00; H02J 3/24; H02J 3/382
See application file for complete search history.

(56) References Cited

U.S. PATENT DOCUMENTS

| | | | | |
|---|---|---|---|---|
| 2009/0240382 | A1* | 9/2009 | Mitani ............... | H02J 3/24 700/298 |
| 2012/0228941 | A1* | 9/2012 | Sakai ............... | H02J 3/383 307/66 |
| 2012/0316696 | A1* | 12/2012 | Boardman ......... | H02J 13/0079 700/297 |

FOREIGN PATENT DOCUMENTS

| JP | 09-046908 A | 2/1997 |
|---|---|---|
| JP | 2007-288878 A | 11/2007 |

(Continued)

OTHER PUBLICATIONS

International Search Report, PCT/JP2016/056699, dated May 17, 2016, 1 pg.

*Primary Examiner* — Yuhui R Pan
(74) *Attorney, Agent, or Firm* — Volpe and Koenig, P.C.

(57) ABSTRACT

A system stabilization control device controls a control instrument within a power system on the basis of measurement information from a plurality of measurement points within the power system. The system stabilization control device includes an equipment information database storing information of system equipment interconnected with the power system; a control priority determining unit determining the control priority of the control instrument on the basis of the information of the system equipment; a control target determining unit determining a control target on the basis of the measurement information from the plurality of measurement points and the control priority; a destabilization time calculating unit calculating destabilization time of the power system from the measurement information from the plurality (Continued)

of measurement points; and a control time determining unit determining control time of the control instrument on the basis of the destabilization time and the information of the system equipment.

8 Claims, 24 Drawing Sheets

(51) Int. Cl.
  *G01R 31/40* (2014.01)
  *G05B 9/02* (2006.01)
  *H02J 3/38* (2006.01)
(52) U.S. Cl.
  CPC ............ *H02J 13/0006* (2013.01); *H02J 3/38* (2013.01); *H02J 3/381* (2013.01); *H02J 3/382* (2013.01); *H02J 3/383* (2013.01); *Y02E 10/563* (2013.01); *Y02E 40/72* (2013.01); *Y04S 10/12* (2013.01); *Y04S 10/123* (2013.01)

(56) References Cited

FOREIGN PATENT DOCUMENTS

| | | |
|---|---|---|
| JP | 2011-115003 A | 6/2011 |
| JP | 2012-170169 A | 9/2012 |

\* cited by examiner

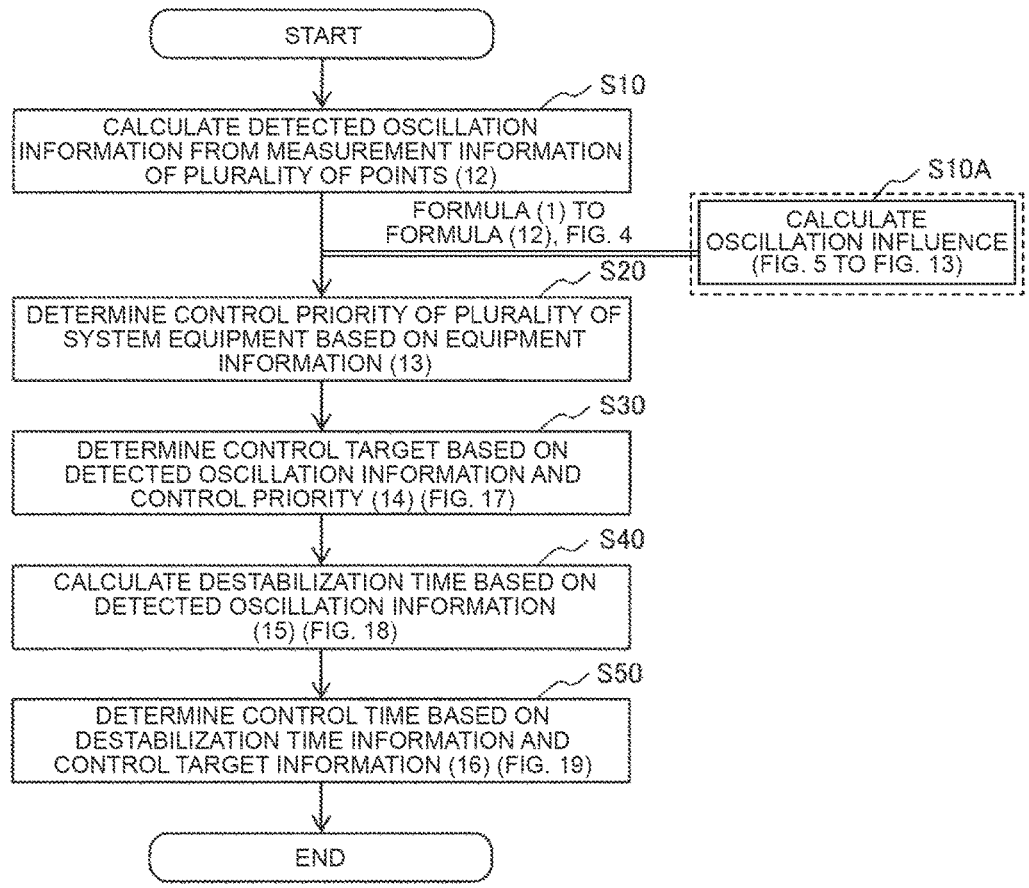

FIG. 4

DETECTED OSCILLATION INFORMATION TABLE

| OSCILLATION NAME | | OSCILLATION FREQUENCY | ATTENUATION COEFFICIENT | AMPLITUDE | INITIAL PHASE |
|---|---|---|---|---|---|
| MEASUREMENT POINT | No. | | | | |
| PMU1 | 1 | 0.18 | −2.0 | 120 | 10 |
| | 2 | 0.65 | −0.5 | 80 | 30 |
| | ⋮ | ⋮ | ⋮ | ⋮ | ⋮ |
| PMU2 | 1 | 0.19 | −1.9 | 90 | 15 |
| | ⋮ | ⋮ | ⋮ | ⋮ | ⋮ |

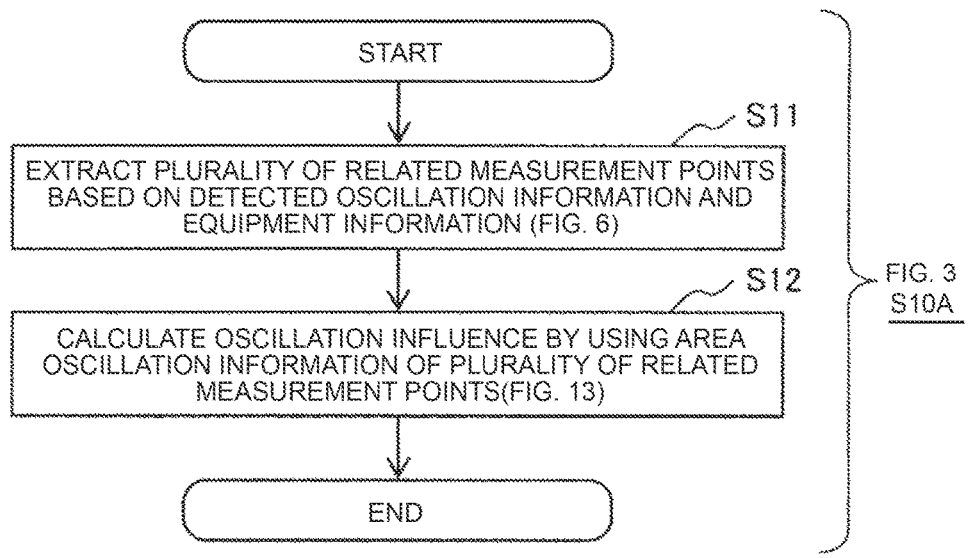

FIG. 5

OSCILLATION INFLUENCE ESTIMATION PROCESSING

START
↓
S11: EXTRACT PLURALITY OF RELATED MEASUREMENT POINTS BASED ON DETECTED OSCILLATION INFORMATION AND EQUIPMENT INFORMATION (FIG. 6)
↓
S12: CALCULATE OSCILLATION INFLUENCE BY USING AREA OSCILLATION INFORMATION OF PLURALITY OF RELATED MEASUREMENT POINTS (FIG. 13)
↓
END

FREQUENCY OSCILLATION INFORMATION TABLE

| OSCILLATION FREQUENCY | OSCILLATION NAME | | ATTENUATION COEFFICIENT | AMPLITUDE | INITIAL PHASE |
|---|---|---|---|---|---|
| | MEASUREMENT POINT | No. | | | |
| 0.18 | PMU1 | 1 | −2.0 | 120 | 10 |
| 0.18 | PMU2 | 1 | −0.9 | 90 | 15 |
| ⋮ | ⋮ | ⋮ | ⋮ | ⋮ | ⋮ |
| 0.65 | PMU1 | 2 | −0.5 | 80 | 30 |
| ⋮ | ⋮ | ⋮ | ⋮ | ⋮ | ⋮ |

FIG. 9

NODE INFORMATION D1

| NODE NAME | POSITION INFORMATION 201 | | GENERATOR 202a | | | LOAD 202b | | | PHASE MODIFIER 202c | | |
|---|---|---|---|---|---|---|---|---|---|---|---|
| 200 | LONGITUDE | LATITUDE | NAME | TYPE | RATING CAPACITY | NAME | TYPE | RATING CAPACITY | NAME | TYPE | RATING CAPACITY |
| A | 36.5 | 138.2 | G1 | THERMAL POWER | 100 | — | — | — | — | — | — |
| B | 37.7 | 140.5 | G2 | WIND POWER | 200 | — | — | — | — | — | — |
| ... | ... | ... | ... | ... | ... | ... | ... | ... | ... | ... | ... |
| AA | 35.7 | 139.8 | — | — | — | L1 | HOUSING | 1000 | — | — | — |
| BB | 35.0 | 139.5 | — | — | — | L2 | FACTORY | 2000 | — | — | — |
| ... | ... | ... | ... | ... | ... | ... | ... | ... | ... | ... | ... |
| AAA | 36.3 | 139.0 | — | — | — | — | — | — | D1 | SC | 10 |
| BBB | 35.6 | 138.6 | — | — | — | — | — | — | D2 | ShR | 20 |
| ... | ... | ... | ... | ... | ... | ... | ... | ... | ... | ... | ... |

POWER LINE INFORMATION D2

| POWER LINE NAME | END NODES | | NORMAL PHASE RESISTANCE R | NORMAL PHASE REACTANCE X | NORMAL PHASE CAPACITANCE C |
|---|---|---|---|---|---|
| a | A | B | 0.01 | 0.2 | 0.1 |
| b | B | C | 0.02 | 0.5 | 0.2 |
| ⋮ | ⋮ | ⋮ | ⋮ | ⋮ | ⋮ |

FIG. 11

MEASUREMENT EQUIPMENT INFORMATION D3

| MEASUREMENT POINT 1 | | MEASUREMENT POINT 2 | | INTER-MEASUREMENT POINT DISTANCE D |
|---|---|---|---|---|
| MEASUREMENT POINT NAME | NODE NAME | MEASUREMENT POINT NAME | NODE NAME | |
| PMU1 | A | PMU2 | B | 15 |
| PMU1 | A | PMU3 | C | 40 |
| ⋮ | ⋮ | ⋮ | ⋮ | ⋮ |

FIG. 12

AREA OSCILLATION INFORMATION D4

| OSCILLATION No. 500 | OSCILLATION FREQUENCY 102 | MEASUREMENT POINT 401 | ATTENUATION COEFFICIENT 103 | AMPLITUDE 104 | INITIAL PHASE 105 |
|---|---|---|---|---|---|
| 1 | 0.18 | PMU1 | −2.0 | 120 | 10 |
|  |  | PMU3 | −1.0 | 30 | −10 |
| 2 | 0.65 | PMU1 | −0.5 | 80 | 30 |
| 3 | 0.18 | PMU2 | −1.9 | 90 | 15 |
| ⋯ | ⋯ | ⋯ | ⋯ | ⋯ | ⋯ |

Figure 15:
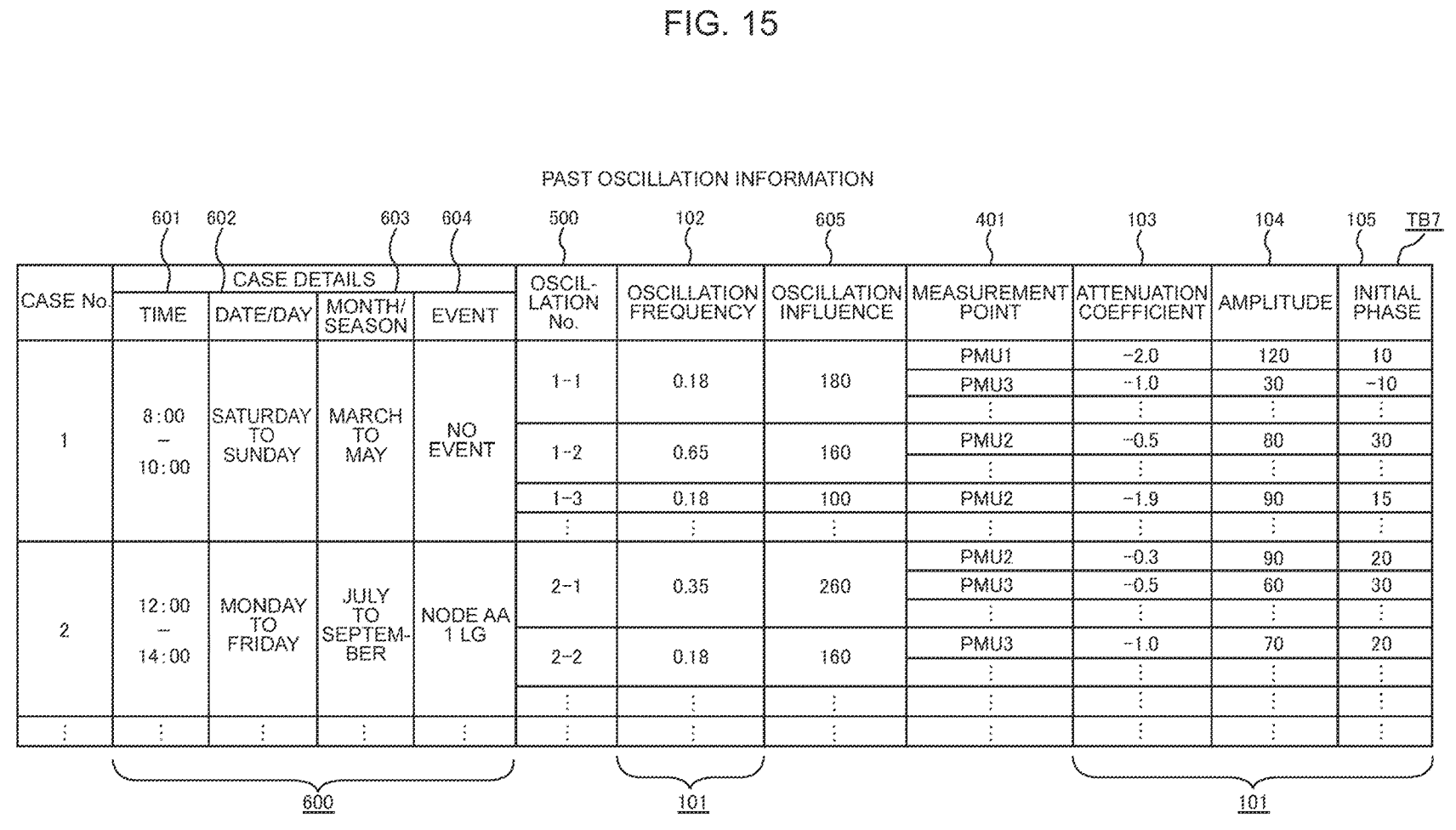

PAST OSCILLATION INFORMATION TB7

| CASE No. | CASE DETAILS 600 | | | OSCIL-LATION No. 500 | OSCILLATION FREQUENCY 102 | OSCILLATION INFLUENCE 605 | MEASUREMENT POINT 401 | ATTENUATION COEFFICIENT 103 | AMPLITUDE 104 | INITIAL PHASE 105 |
|---|---|---|---|---|---|---|---|---|---|---|
| | TIME 601 | DATE/DAY 602 | MONTH/SEASON 603 | EVENT 604 | | | | | | |
| 1 | 8:00 – 10:00 | SATURDAY TO SUNDAY | MARCH TO MAY | NO EVENT | 1-1 | 0.18 | 180 | PMU1 | -2.0 | 120 | 10 |
| | | | | | 1-2 | 0.65 | 160 | PMU3 | -1.0 | 30 | -10 |
| | | | | | 1-3 | 0.18 | 100 | PMU2 | -0.5 | 80 | 30 |
| 2 | 12:00 – 14:00 | MONDAY TO FRIDAY | JULY TO SEPTEMBER | NODE AA 1LG | 2-1 | 0.35 | 260 | PMU2 | -1.9 | 90 | 15 |
| | | | | | | | | PMU3 | -0.3 | 90 | 20 |
| | | | | | 2-2 | 0.18 | 160 | PMU3 | -0.5 | 60 | 30 |
| | | | | | | | | | -1.0 | 70 | 20 |
| ... | ... | ... | ... | ... | ... | ... | ... | ... | ... | ... | ... |

101

SYSTEM STABILIZATION CONTROL DEVICE AND POWER SYSTEM CONTROL SYSTEM

TECHNICAL FIELD

The present invention relates to a system stabilization control device and a power system control system.

BACKGROUND ART

A power system is configured from numerous generators, loads, power transmission/distribution instruments and control devices. In a steady state, minor disturbances caused by load fluctuation and system switching are applied to the power system. When a malfunction such as a ground fault or short circuit of the system occurs, major disturbances are applied to the power system. Due to these disturbances, power oscillation having a plurality of oscillation mode components is generated.

When the oscillation mode components are small or attenuated quickly, the power system will be in a stable state because the system oscillation after the generation of disturbances is maintained within a sufficiently small range. Nevertheless, when the oscillation increases or is not attenuated and continues or is diffused, the generators may be shut down and a wide-area power failure may occur, and, consequently, stable operation may become impossible.

Pursuant to the expansion in the size of power systems, the tendency is the increase in power source capacity, installation at remote locations, and localization, as well as the consequential extension of power line length and multiple tidal currents. Because the influence from these changes will work toward the decrease in stability of the power system, there is concern of a chain-reaction influence to the major loss of power and wide-area power failure triggered by the power swing of generators during a system malfunction.

Thus, an online system stabilization control system for constantly monitoring the stability of the system and preventing/predicting the influence on a wide-area power failure is required.

In recent years, a PMU (Phasor Measurement Unit) for measuring the generating line voltage phase angle of the power system, substantially in real time, based on synchronous measurement using a GPS (Global Positioning System), is coming into wide use. It is now becoming possible to comprehend, in real time, the power oscillation phenomenon by using the online measured values of the system generating line voltage measured using the PMU.

Based on the foregoing background, proposed is a system stabilization control technology for a business operator operating a power system to monitor and stabilize the system condition. For example, PTL 1 discloses the following: "A power system stabilization device for stabilizing a phenomenon in which numerous generators of a power system becomes unstable due to a system malfunction of the power system to which a generator group consisting of a plurality of generators is connected by quickly blocking certain generators of a control target power plant connected to the power system, comprising: double-generator system model creation means for calculating, in cases where the power system is equivalently represented as a generator group in the control target power plant and a generator group in another primary power system during a steady state before the occurrence of the system malfunction, a generator constant and an initial state amount at a constant frequency of roughly several minutes; electric quantity detection means for detecting a voltage and a current and power of the control target power plant with the occurrence of the system malfunction as the activation condition; external reactance estimation means for inputting an electric quantity detected by the electric quantity detection means and computing an external reactance upon viewing the primary power system from a generating line of the control target power plant after elimination of the system malfunction; electrically controlled generator determining means for computing oscillation of two equivalent generators which equivalently represent an operation of the generator group in the control target power plant and the generator group in the other primary power system based on the generator constant and the initial state amount calculated by the double-generator system model creation means, the external reactance calculated by the external reactance estimation means and the electric quantity detected by the electric quantity detection means, and determining an electrically controlled generator required for stabilization, via an extended equivalent area method, based on the foregoing computation result and priority of electric control of the respective generators set in advance; and control means for paralleling off the generator selected by the electrically controlled generator determining means from the power system".

CITATION LIST

Patent Literature

PTL 1: Japanese Patent Application Publication No. H09-046908

SUMMARY OF THE INVENTION

Problems to be Solved by the Invention

In recent years, renewable energy as represented with solar power generation and wind power generation is being considerably introduced into systems. The foregoing renewable energy is associated with fluctuations in the power generation output that are sharp and difficult to anticipate in advance and, consequently, this may considerably change the system characteristics. For example, when the wind velocity exceeds a certain threshold, wind power generation is automatically stopped to ensure the safety of the instruments, and the operation known as "cut out" of causing the power generation output to be zero is activated. This kind of phenomenon occurs more frequently in comparison to the short circuit/ground fault malfunctions that occur in conventional systems, and, when the generators are installed close together in adjacent regions, it is anticipated that this phenomenon is likely to occur simultaneously in a plurality of generators.

As the amount of renewable energy that is introduced increases, the impact on the system caused by the foregoing sharp output fluctuation event will increase, and there is concern that the oscillation mode will become destabilized in a wide area. In order to deal with the foregoing problem, stabilization control based on high-speed and highly precise stabilization determination in a middle region of several seconds to several ten seconds from the occurrence of the output fluctuation event is required.

Furthermore, in order to realize high-speed stabilization control, the control method that enables stabilization must be selected online for each unstable oscillation mode that occurs. With respect to this point, it is difficult to realize high-speed and highly precise stabilization control with the technology described in PTL 1.

In light of the above, an object of the present invention is to provide a system stabilization control device capable of achieving high-speed and highly precise stabilization control, and a power system control system.

Means to Solve the Problems

In order to achieve the foregoing object, the present invention provides a system stabilization control device for controlling a control instrument installed within a power system based on measurement information from a plurality of measurement points within the power system, comprising: an equipment information database for storing information of system equipment that is interconnected with the power system; a control priority determining unit for determining a control priority of the control instrument based on information of the system equipment; a control target determining unit for determining a control target based on the measurement information from the plurality of measurement points and the control priority; a destabilization time calculating unit for calculating destabilization time of the power system from the measurement information from the plurality of measurement points; and a control time determining unit for determining control time of the control instrument based on the destabilization time and the information of the system equipment.

The present invention additionally provides a system stabilization control device for controlling a control instrument installed within a power system based on measurement information from a plurality of measurement points within the power system, comprising: an equipment information database for storing equipment information of system equipment including the control instrument that is interconnected with the power system; a control priority determining unit for determining the control priority of the control instrument based on the equipment information; a control target determining unit for determining the control instrument to be controlled according to a distance between oscillation measurement points of power system oscillation detected from the measurement information and the control instrument, and the priority; a destabilization time calculating unit for calculating destabilization time of the power system oscillation detected from the measurement information; and a control time determining unit for determining control time based on the destabilization time and the equipment information, wherein the system stabilization control device controls the determined control instrument for the determined control time.

The present invention additionally provides a power system control system for obtaining, in a system stabilization control device, measurement information from a plurality of measurement points within a power system via first communication means, and giving control instructions to a control instrument within system equipment configuring the power system from the system stabilization control device via second communication means, wherein the system stabilization control device comprises: an equipment information database for storing information of system equipment that is interconnected with the power system; a control priority determining unit for determining a control priority of the control instrument based on information of the system equipment; a control target determining unit for determining a control target based on measurement information from a plurality of measurement points and the control priority; a destabilization time calculating unit for calculating destabilization time of the power system from the measurement information from the plurality of measurement points; a control time determining unit for determining control time based on the destabilization time and the equipment information; and an output unit for giving the control instructions including the determined control instrument and the determined control time via the second communication means.

Advantageous Effects of the Invention

According to the present invention, it is possible to obtain a system stabilization control device capable of achieving high-speed and highly precise stabilization control, and a power system control system.

BRIEF DESCRIPTION OF DRAWINGS

FIG. 3 is a flow diagram showing the system stabilization control determination processing.

FIG. 4 is a diagram showing the contents stored in the detected oscillation information table which stores the oscillation components at the respective measurement points obtained by the oscillation detection unit 12.

FIG. 5 is a flowchart showing the oscillation influence estimation processing which implies the extraction of a plurality of measurement points and the calculation of the oscillation influence.

FIG. 7 is a diagram showing an example of the frequency oscillation information table TB2.

FIG. 9 is a diagram showing the node information table TB3 in the equipment information database DB.

FIG. 10 is a diagram showing the power line information table TB4 in the equipment information database DB.

FIG. 11 is a diagram showing the measurement equipment information table TB5 in the equipment information database DB.

FIG. 12 is a diagram showing an example of the area oscillation information table TB6 obtained with the processing of processing step S113.

FIG. 15 is a diagram showing an example of the past oscillation information table TB7.

DESCRIPTION OF EMBODIMENTS

Embodiments of the present invention are now explained in detail with reference to the appended drawings. Note that the ensuing description is merely an example of embodiments, and is not intended to limit the invention itself to the following specific contents.

Embodiment 1

Figure 1:
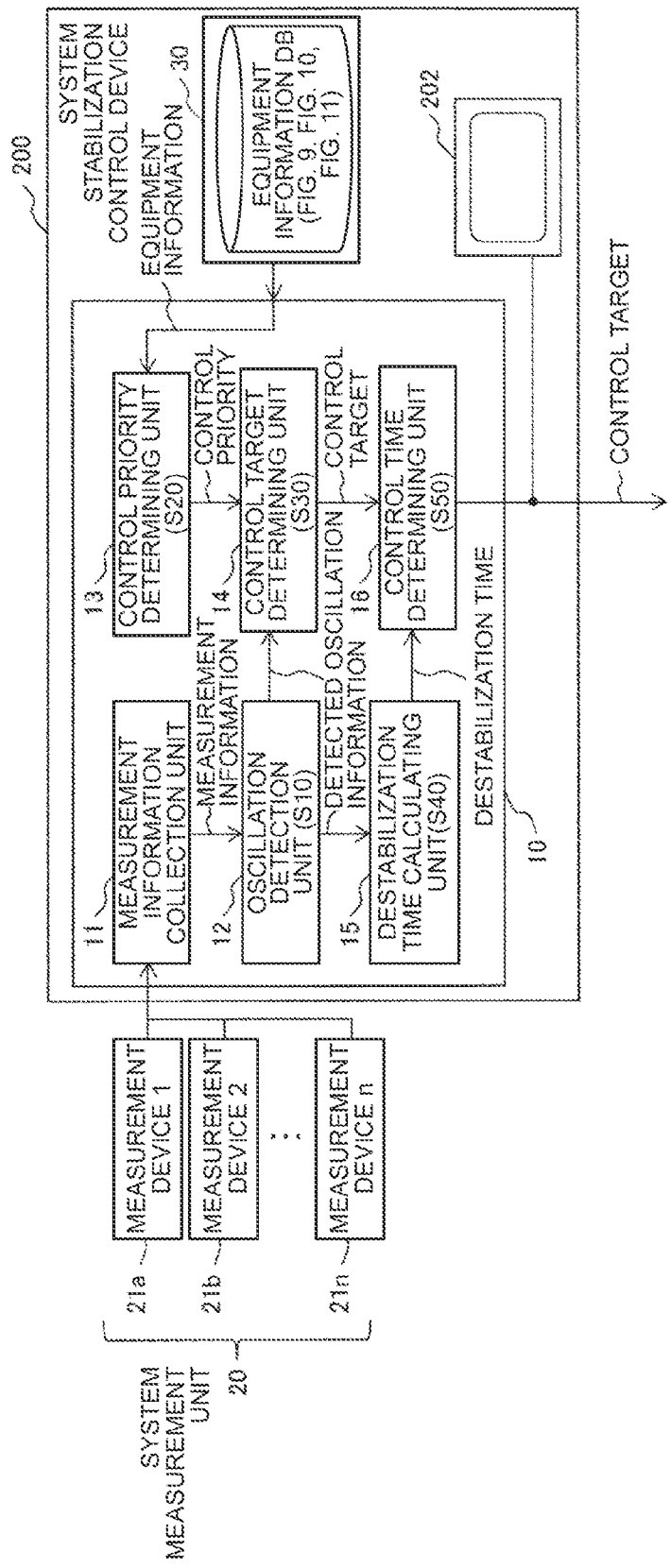
FIG. 1 shows a functional configuration example of the system stabilization control device according to an embodiment of the present invention.

FIG. 1 is a diagram showing a functional configuration example of the system stabilization control device according to an embodiment of the present invention.

The system stabilization control device 200 according to this embodiment includes a system stabilization control determining unit 10, and an information storage unit 30. Among the above, the system stabilization control determining unit 10 is connected to a system measurement unit 20. The system measurement unit 20 is configured from measurement devices 21 (21a, 21b, . . . 21n) for measuring the measurement information of a plurality of points. The information storage unit 30 stores equipment information in an equipment information database DB. In the ensuing explanation, when there is no need to differentiate the elements with alphabets, there may be cases where such alphabets are omitted.

The system stabilization control determining unit 10 includes a measurement information collection unit 11, an oscillation detection unit 12, a control priority determining unit 13, a control target determining unit 14, a destabilization time calculating unit 15, and a control time determining unit 16.

The measurement information collection unit 11 receives and collects, via an information communication network, the measurement information (system state quantity) of the plurality of points measured by the measurement device 21 of the system measurement unit 20.

The oscillation detection unit 12 calculates, based on the measurement information collected by the measurement information collection unit 11, detected oscillation information indicating the oscillation components, which are the frequency components of the oscillation of power, for each measurement point, with regard to measurement information of a specific type (measurement type).

The control priority determining unit 13 calculates the control performance of a plurality of equipment based on the equipment information stored in the equipment information database DB, and determines the control priority of each equipment based on the control performance.

The control target determining unit 14 determines the control target based on the control priority determined by the control priority determining unit 13 and the detected oscillation information calculated by the oscillation detection unit 12.

The destabilization time calculating unit 15 calculates the destabilization time, which is the critical time that the system becomes destabilized, based on the detected oscillation information calculated by the oscillation detection unit 12.

The control time determining unit 16 determines the control target based on the equipment information and the destabilization time calculated by the destabilization time calculating unit.

Note that the system stabilization control device 200 is equipped with an input operation instrument such as a monitor 202 and a keyboard, and the user can confirm the internal processing contents as needed, and perform input processing for inputting setting as needed.

The system measurement unit 20 measures the measurement information at the measurement points within the system, and sends the measured measurement information to the measurement information collection unit 11. The measurement information includes at least one type among valid power tidal current, invalid power tidal current, system voltage, system current, and voltage phase. The system measurement unit 20 includes measurement devices 21a, 21b, . . . , 21n disposed at each of the plurality of measurement points. The measurement device 21 is, for example, a PMU (Phasor Measurement Unit), and performs periodic measurements related to power, and sends time series measurement information.

The equipment information database DB in the information storage unit 30 stores equipment information indicating the connection information of system elements that are interconnected with the power system. Equipment information includes at least one type among information (node information D1) indicating the characteristics of the system elements (electric power equipment) connected to the respective nodes within the system such as the generators, loads, and phase modifiers that are interconnected near the measurement points, information (power line information D2) indicating the impedance of the power line connecting the respective nodes, and information (measurement equipment information D3) indicating the positional relationship such as the latitude/longitude and the topology of the plurality of measurement points. It is thereby possible to calculate the electrical distance between the measurement points, and classify the measurement points based on electrical distance. Note that the node information D1, the power line information D2, and the measurement equipment information D3 will be described in detail later with reference to FIG. 9, FIG. 10, and FIG. 11.

Figure 2:
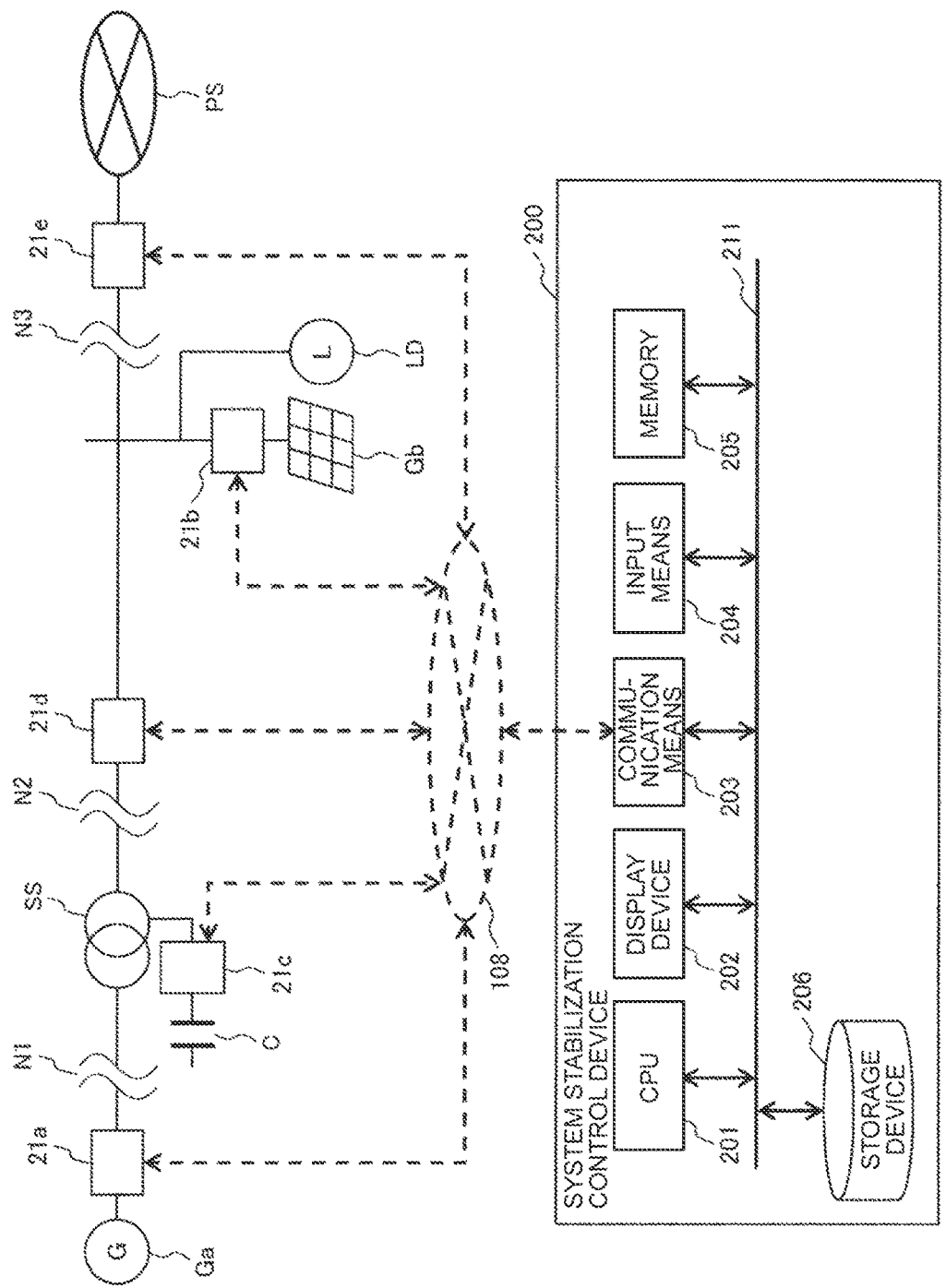
FIG. 2 shows a configuration example of the power system control system according to an embodiment of the present invention.

FIG. 2 shows a configuration example of the power system control system according to an embodiment of the present invention.

As shown in FIG. 2, the power system control system according to an embodiment of the present invention includes a generator G, nodes (generating lines) N (N1, N2, N3), a substation SS, a phase modifier C, an electric power load LD, an external power system PS, measurement devices 21 (21a, 21b, . . . 21e), an information communication network 108, and a system stabilization control device 200. In the ensuing explanation, the power system including the generator G, the substation SS, the phase modifier C, the electric power load LD, and the measurement devices 21 (21a, 21b, ... 21e) is sometimes referred to as the host system.

The generator G is a generator which generates electric power, and generates electric power based on a power generation method including any one among thermal power generation, hydraulic power generation, nuclear power generation, solar power generation, wind power generation, biomass power generation, and tidal current power generation.

The generator Ga is a large-scale generator including thermal power generation, hydraulic power generation, and nuclear power generation that is installed on the high voltage side of the substation SS in the power system, and sends the system state quantity including the electric power generation to the system stabilization control device 200 through the measurement device 21a and the information communication network 108. Moreover, the generator Ga receives the control instruction information sent from the system stabilization control device 200 via the measurement device 21a and the information communication network 108, and changes the system state quantity including the electric power generation according to the control instruction information.

The generator Gb is a medium/small-scale generator including solar power generation, wind power generation, and co-generation that is installed on the low voltage side of the substation SS in the power system, and sends the system state quantity including the electric power generation to the system stabilization control device 200 through the measurement device 21b and the information communication network 108.

The substation SS is installed between the power lines within the power system, changes the voltage value of the power transmitted from the high voltage side where the generator Ga (large-scale generator) is installed, and transmits power to the low voltage side where the electric power load LD is installed. A phase modifier C such as a power capacitor or a shunt reactor is connected to the substation SS.

The phase modifier C is an instrument for controlling the voltage distribution within the power system by changing the invalid power within the power system, and is configured from, for instance, a power capacitor, a shunt reactor, a STATCOM (Static Synchronous Compensator), or an SVC (Static Var Compensator). Certain phase modifiers C receive the control instruction information sent from the system stabilization control device 200 through the measurement device 21c and the information communication network 108, and change the system state quantity including the electric power generation according to the control instruction information.

The electric power load LD is a facility including electrical machinery and lighting equipment that consumer power, and represents houses, factories, buildings and other facilities.

The external power system PS is an external power system that cannot be controlled from the system stabilization control device 200, and is connected to the host system via a interconnection line.

The measurement devices 21 (21a, 21b, ... 21e) include sensors for measuring the system quantity such as the electric power generation in the generator Ga, the phase modification amount in the phase modifier C, and the tidal current value and the voltage value in the power line, and send the measured system state quantity to the system stabilization control device 200 through the information communication network 108.

The information communication network 108 is a network capable of transmitting data bidirectionally. The information communication network 108 is, for example, a wired network or a wireless network, or a combination thereof. The information communication network 108 may be the so-called internet, or a network of a dedicated line.

The system stabilization control device 200 is a device for realizing the system stabilization control function illustrated in FIG. 1. The system stabilization control device 200 receives, through the information communication network 108, the system state quantity measured by the measurement devices 21 (21a, 21b, ... 21e). Moreover, the system stabilization control device 200 sends to the measurement device 21, through the information communication network 108, the control instruction information calculated using the received system state quantity of the system and the information that was accumulated internally.

As the internal configuration of the system stabilization control device 200, a CPU (Central Processing Unit) 201, a display device 202, a communication means 203, an input means 204, a memory 205, and a storage device 206 are connected to a bus line 211. The CPU 201 executes calculation programs stored in the storage device 206 to calculate the system, generate control signals, and generate image data, and displays the image data on the display device 202. The memory 205 is a memory for temporarily storing the image data to be displayed and the calculation result data of the system state, and is configured, for example, from a RAM (Random Access Memory). The communication means 203 acquires the system state quantity such as the tidal current value and the voltage value from the measurement device 21 through the information communication network 108. The measurement information collection unit 11 uses the communication means 203 to receive the time series measurement information measured by the plurality of measurement devices 21.

The user (administrator) of the system stabilization control device 200 can set or change parameters, such as various types of thresholds, through a predetermined interface of the input means 204, and appropriately set the operation of the system stabilization control device 200 of the host system. Moreover, the user select the type of data to be confirmed through a predetermined interface of the input means 204, and display such data on the display device 202.

The storage device 206 stores various types of programs and data. The storage device 206 is, for example, an HDD (Hard Disk Drive) or a flash memory. The storage device 206 retains, for example, programs and data that are capable of realizing the various types of functions described later. The programs and data stored in the storage device 206 are read and executed by the CPU 201 as needed. Note that the storage device 206 realizes the information storage unit 30, and stores various types of databases (DB).

FIG. 3 is a flow diagram showing the system stabilization control determination processing. Each processing determination flow of FIG. 3 corresponds to each unit of the system stabilization control determining unit 10 of FIG. 1. Specifically, processing step S10 of FIG. 3 corresponds to the oscillation detection unit 12 of FIG. 1, the processing step S20 corresponds to the control priority determining unit 13, the processing step S30 corresponds to the control target determining unit 14, the processing step S40 corresponds to the destabilization time calculating unit 15, and the processing step S50 corresponds to the control time determining unit 16, respectively. Because FIG. 1 and FIG. 3 have the foregoing correspondence, these will be compared in the ensuing explanation.

Foremost, the oscillation detection unit 12 of FIG. 1 (processing step S10 of FIG. 3) calculates the detected oscillation information by using the measurement information of the plurality of points measured by the system measurement unit 20.

Here, the measurement information of the plurality of points measured by the system measurement unit 20 includes information of at least one measurement type among valid power tidal current, invalid power tidal current, system voltage, system current, and voltage phase. The system stabilization control device 200 may perform system stabilization control determination processing to one specific measurement type, or perform system stabilization control determination processing to a plurality of measurement types. For the calculation of the detected oscillation information in this processing, an algorithm used for frequency analysis; that is, at least one algorithm among Fourier analysis, wavelet analysis, Prony method, Matrix Pencil method, and HTLS (Hankel Total Least Squares) method is applied.

In the ensuing explanation, the oscillation information calculation algorithm based on the Prony method is explained. With oscillation information calculation algorithm based on the Prony method, Formula (1) to Formula (12) below are executed. Note that, upon executing these formulas, let it be assumed that the data quantity N and mode degree n of the analysis window width have been set in advance.

The oscillation detection unit 12 foremost executes Formula (1) to Formula (4) below by using input data y(k) (k=0, 1, :, N−1) as the measurement information of the respective points to calculate the matrix $a=(a_1, a_2, :, a_n)^T$. However, the superscript letter of "T" is the transposed matrix, and the superscript number of "−1" is the inverse matrix.

Here, Formula (1) is the mathematical formula for calculating the autoregression model coefficient vector a, Formula (2) is the definitional equation of the autoregression model coefficient vector a of Formula (1), Formula (3) is the definitional equation of X of Formula (1), and Formula (4) is the definitional equation of Y of Formula (1). Note that, in Formula (3), k represents the time, y represents the measured value as the input (value from the measurement device 21; for instance, value from the PMU), n represents the mode degree set in advance, and N represents the analysis window width set in advance (meaning the data size of buffering the measured value for the signal processing).

[Math 1]

$$a = (X^T X)^{-1} X^T y \quad (1)$$

[Math 2]

$$a = \begin{bmatrix} a_1 \\ a_2 \\ \vdots \\ a_n \end{bmatrix} \quad (2)$$

[Math 3]

$$X = \begin{bmatrix} y(n-1) & y(n-2) & \cdots & y(0) \\ y(n) & y(n-1) & \cdots & y(1) \\ \vdots & \vdots & \ddots & \vdots \\ y(N-2) & y(N-3) & \cdots & y(N-n-1) \end{bmatrix} \quad (3)$$

[Math 4]

$$y = \begin{bmatrix} y(n) \\ y(n+1) \\ \vdots \\ y(N-1) \end{bmatrix} \quad (4)$$

Next, the oscillation detection unit 12 executes Formula (5) to Formula (7) to calculate the eigenvalue λ. Here, Formula (5) is the characteristic equation for calculating the eigenvalue by using the autoregression model coefficient $(a_1, a_2, \ldots, a_n)$ calculated in Formula (1), Formula (6) is the relational expression of the solution Z and the eigenvalue λ, and Formula (7) is the relational expression of the eigenvalue λ and the attenuation coefficient σ/oscillation frequency ω.

Specifically, foremost, the autoregression model coefficient $(a_1, a_2, \ldots, a_n)$ calculated based on foregoing Formula (1) to Formula (4) are substituted into Formula (5) below. Formula (5) is the n-th degree polynomial expression (characteristic equation) with $Z_i$ as the solution, and n-number of $Z_i$, $\sigma_i$, and $f_i$ are respectively obtained as the solution.

Subsequently, the oscillation detection unit 12 substitutes $Z_i$ represented in the format of Formula (6) and Formula (7) in the solution Z of the characteristic equation of Formula (5) to calculate the eigenvalue $\lambda_i$, the attenuation coefficient (attenuation factor) $\sigma_i[1/\text{sec}]$, and the oscillation frequency $f_i[\text{Hz}]=\omega_i/2\pi$. Here, Δt represents the sampling frequency.

[Math 5]

$$Z^n - (a_1 Z^{n-1} + a_2 Z^{n-2} + \ldots + a_n Z^0) = 0 \quad (5)$$

[Math 6]

$$Z_i = \exp(\lambda_i \Delta t) \quad (6)$$

[Math 7]

$$\lambda_i = \sigma_i + \omega_i j \quad (7)$$

Next, the oscillation detection unit 12 calculates the matrix $b=(B_1, B_2, \ldots, B_n)^T$ from Formula (8) to Formula (11) below by using the input data y(k) (k=0, 1, ..., N−1) and the calculated $Z_i$ (i=1, 2, ..., n). Here, Formula (8) is the mathematical formula for calculating the complex amplitude vector b, Formula (9) is the definitional equation of the vector b of Formula (8), Formula (10) is the definitional equation of the solution Z of Formula (8), and Formula (11) is the definitional equation of w of Formula (8). Note that the elements in Formula (8) are the complex amplitude B of each oscillation mode, and y in Formula (11) is the measured value.

[Math 8]

$$b = (Z^T Z)^{-1} Z^T w \quad (8)$$

[Math 9]

$$b = \begin{bmatrix} B_1 \\ B_2 \\ \vdots \\ B_n \end{bmatrix} \quad (9)$$

-continued

[Math 10]

$$Z = \begin{bmatrix} Z_1^0 & Z_2^0 & \ldots & Z_n^0 \\ Z_1^1 & Z_2^1 & \ldots & Z_n^1 \\ \vdots & \vdots & \ddots & \vdots \\ Z_1^{N-1} & Z_2^{N-1} & \ldots & Z_n^{N-1} \end{bmatrix} \quad (10)$$

[Math 11]

$$w = \begin{bmatrix} y(0) \\ y(1) \\ \vdots \\ y(N-1) \end{bmatrix} \quad (11)$$

Finally, the oscillation detection unit 12 obtains the absolute value $R_i$ and the declination $\theta_i$ represented in Formula (12) from the complex amplitude B ($B_1$, $B_2$, :, $B_n$) calculated based on Formula (8) to Formula (11). Here, the absolute value $R_i$ represents the amplitude, and the declination $\theta_i$ represents the initial phase. Note that Formula (12) is the relational expression of the complex amplitude B and the amplitude R/phase θ.

[Math 12]

$$B_i = R_i \exp(j\theta_i) \quad (12)$$

Based on the foregoing processing, it is possible to obtain the detected oscillation information including oscillation frequency, attenuation coefficient, amplitude, and initial phase. As a result of the detected oscillation information including one among oscillation frequency, attenuation coefficient, and amplitude, it is possible to represent the oscillation components in the respective measurement points. Moreover, as a result of using the foregoing detected oscillation information, it is possible to predict the future oscillation components.

FIG. 4 is a diagram showing the contents stored in the detected oscillation information table TB1 which stores the oscillation components at the respective measurement points obtained with the processing of foregoing Formula (1) to Formula (12).

The detected oscillation information table TB1 of FIG. 4 includes an entry for each detected oscillation information. The entry corresponding to one detected oscillation information includes the detected oscillation identifying information (oscillation name in FIG. 4) 100 for identifying the detected oscillation information, and the oscillation characteristics 101 indicating the characteristics of the oscillation represented by the detected oscillation information. The detected oscillation identifying information 100 includes a name 100a of the measurement point corresponding to the input data, and a detected oscillation information number (No.) 100b indicating the mode of the detected oscillation information.

When the detected oscillation information is calculated using the foregoing Prony method, the mode degree n and the same number of detected oscillation information are calculated for one type of measurement information of one measurement point. Accordingly, when measurement information of q-number of types (q≥1) at each point of p-number of points (p≥1) is used, detected oscillation information in a number of n×p×q is calculated. The oscillation characteristics 101 include a calculated oscillation frequency 102, an attenuation coefficient 103, an amplitude L, and an initial phase 105.

While the oscillation detection unit 12 (processing step S10 of FIG. 3) calculates the detected oscillation information in the manner described above, this can also be used as the following processed information. An example of processed information is the oscillation influence, and the processing step for obtaining the oscillation influence is indicated as S10A with a dotted line in FIG. 3.

In processing step S10A of the oscillation detection unit 12, a plurality of measurement points related to each oscillation component determined to be the same are extracted based on the detected oscillation information obtained in processing step S10 and the data of the equipment information database DB stored in the information storage unit 30, and the oscillation influence representing the size of the influence of the oscillation component is calculated. As a result of determining the system stabilization control by using the oscillation influence, because the range that is considerably influenced by oscillation is wide, it is possible to select the control which preferentially stabilizes the oscillation that will considerably influence the system when it is unstable.

The series of processing of processing step S10A (extraction of plurality of measurement points and calculation of oscillation influence) of the oscillation detection unit 12 are now explained in detail with reference to FIG. 5 to FIG. 13.

Foremost, FIG. 5 is a flowchart showing the oscillation influence estimation processing which represents the series of processing (extraction of a plurality of measurement points and calculation of the oscillation influence) of processing step S10A. The flowchart of FIG. 5 is executed by the oscillation detection unit 12 of FIG. 1, and is a materialization of the processing of processing step S10A of FIG. 3. In the first processing step S11 of FIG. 5, the oscillation influenced point extraction processing for extracting a plurality of measurement points related to each oscillation component determined to be the same is performed. In the next processing step S12, the oscillation influence representing the size of influence of the oscillation components. Note that the detailed processing contents of processing step S11 are shown in the processing flowchart of FIG. 6, and the detailed processing contents of processing step S12 are shown in the processing flowchart of FIG. 6.

Figure 6:
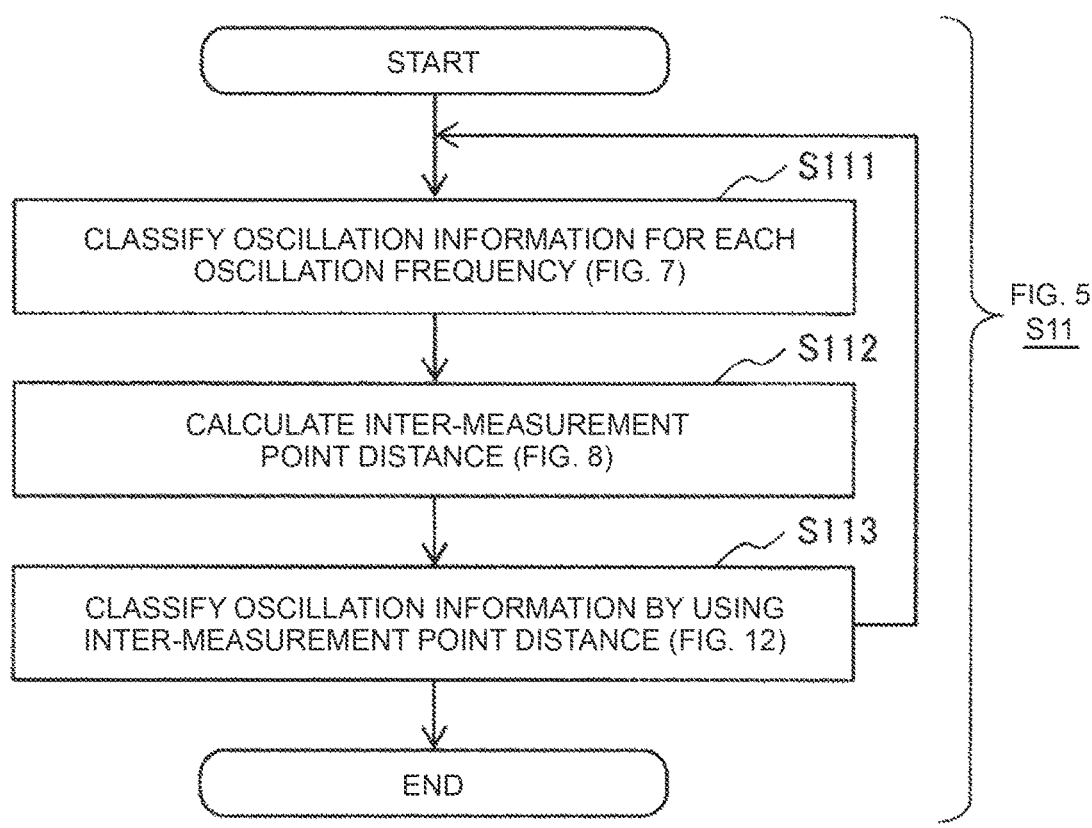
FIG. 6 is a diagram showing the detailed contents of the oscillation influenced point extraction processing (processing step S11).

FIG. 6 is a diagram showing the detailed contents of the oscillation influenced point extraction processing (processing step S11). Here, in the first processing step S111, the plurality of detected oscillation information calculated by the oscillation detection unit 12 are classified based on oscillation frequency, and the result is stored as the frequency oscillation information table TB2 in the information storage unit 30. Note that, as the plurality of detected oscillation information calculated by the oscillation detection unit 12, the table previously stored as the foregoing detected oscillation information table TB1 in the information storage unit 30 is used.

FIG. 7 shows an example of the frequency oscillation information table TB2. As evident upon comparing the table TB2 of FIG. 7 with the table TB1 of FIG. 4, the table TB2 is a result of replacing the order of description of the table TB1 of FIG. 4 from the perspective of the oscillation frequency 102.

To explain the frequency oscillation information table TB2 of FIG. 7 in further detail, this includes an entry for each frequency oscillation information. The entry corresponding to one frequency oscillation information includes the oscillation frequency 102 of the oscillation component corresponding to the frequency oscillation information, the detected oscillation identifying information 100 (oscillation name in FIG. 7), and the oscillation characteristics 101 indicating the characteristics of at least one detected oscillation information having an oscillation frequency that is close to the oscillation frequency. The detected oscillation identifying information 100 is the same as the detected oscillation identifying information 100a, 100b of the detected oscillation information. The oscillation characteristics 101 include an attenuation coefficient 103, an amplitude 104, and an initial phase 105.

In the example of the frequency oscillation information table TB2, the frequency oscillation information having an oscillation frequency close to 0.18 includes the No. 1 detected oscillation information at the measurement point PMU 1, and the No. 1 detected oscillation information at the measurement point PMU 2. Similarly, the frequency oscillation information having an oscillation frequency close to 0.65 includes the No. 2 detected oscillation information at the measurement point PMU 1. In the ensuing explanation, the measurement points included in one frequency oscillation information are hereinafter sometimes referred to as the measurement point group candidate.

Note that, during the foregoing classification, the oscillation detection unit 12 may also use the predetermined frequency width indicating the difference of oscillation frequencies and classify the detected oscillation information, in which the difference of oscillation frequencies is within the frequency width, as the frequency oscillation information of the same operating frequency. In the example of the foregoing detected oscillation information table TB1, while the oscillation frequency of the No. 1 detected oscillation information at the measurement point PMU 2 is 0.19, and the oscillation frequency of the No. 1 detected oscillation information at the measurement point PMU 1 is 0.18, they are classified as the same frequency oscillation information. As a result of classifying the detected oscillation information, in which the oscillation frequency is within the frequency width, as the same frequency oscillation information, it is possible to accurately estimate the distribution of each oscillation within the system even in cases where each detected oscillation information contains errors caused by noise.

Here, the frequency width which prescribes the range of the oscillation frequency to be included in the same classification may also be defined based on the number of measurement information that is used as the input data. As an example, the frequency width $\Delta f$ of the oscillation frequency to be included in the same frequency oscillation information is shown in Formula (13). Formula (13) is the formula representing the method of determining the frequency width $\Delta f$ based on the sampling theorem. Here, let it be assumed that N is the number of input data of the measurement information used for measuring the detected oscillation information, $\Delta fs$ is the sampling frequency of the measurement information, and $\alpha$ is the constant designated in advance. Generally speaking, because the frequency resolution in a frequency analysis is high when the sampling frequency of the input data is low and becomes high when the number of data is large, the frequency width $\Delta f$ of the oscillation frequency to be included in the same frequency oscillation information can be appropriately selected based on Formula (13).

[Math 13]

$$\Delta f = \alpha \cdot \Delta fs / N \quad (13)$$

Next, the oscillation detection unit 12 performs the inter-measurement point distance calculation processing for calculating the inter-measurement point distance based on the data of the equipment information database DB stored in the information storage unit 30 in processing step S112 of FIG. 6.

Figure 8:
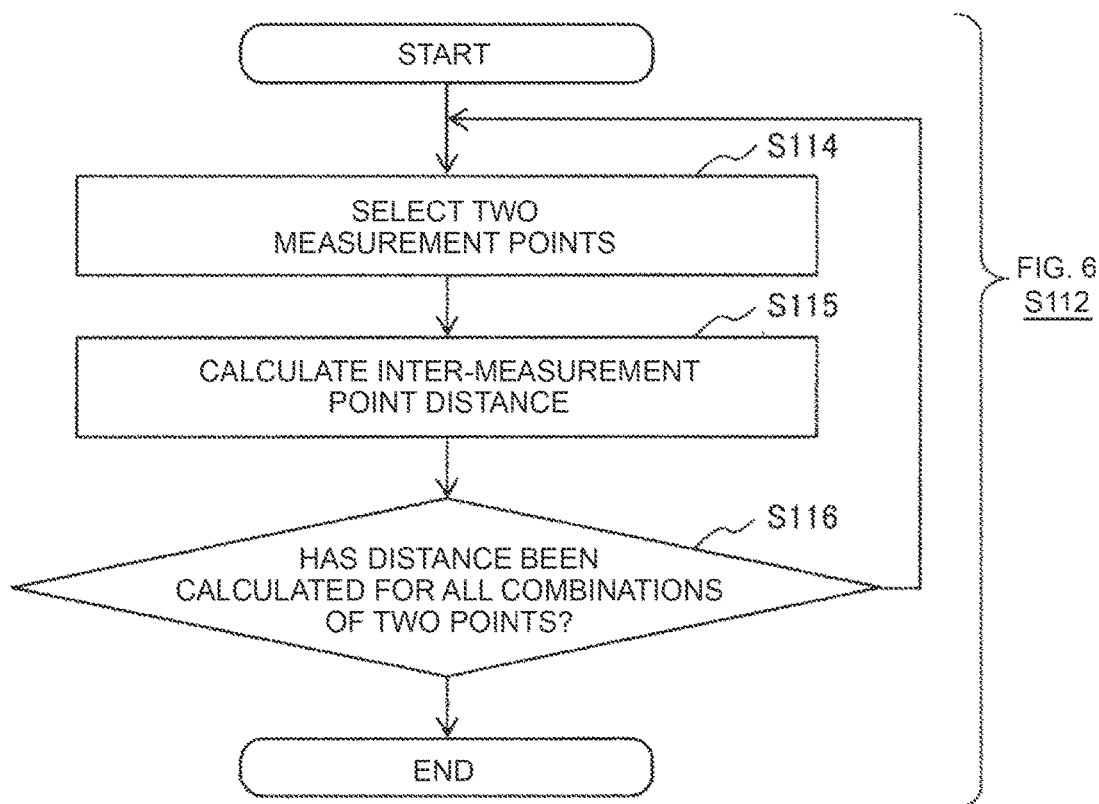
FIG. 8 is a flowchart showing the details of the inter-measurement point distance calculation processing in processing step S112.

FIG. 8 is a flowchart showing the details of the inter-measurement point distance calculation processing in processing step S112. In the first processing step S114 of FIG. 8, two measurement points are selected in order from the measurement points of the measurement information acquired by the measurement information collection unit 11.

In the next processing step S115, the inter-measurement point distance between the selected two measurement points is calculated based on the data stored in the equipment information database DB retained in the information storage unit 30. The data of the equipment information database DB referred to above includes the node information D1, the power line information D2, and the measurement equipment information D3 explained above.

FIG. 9 is a diagram showing the node information table TB3 storing the node information D1 among the data of the equipment information database DB.

The node information table TB3 storing the node information D1 includes a node name 200 for identifying the node for each node in the power system, position information 201 indicating the position of the node represented with, for instance, a longitude and a latitude, and characteristics 202 of the generator, the electric power load, and the phase modifier connected to the node. In the example of FIG. 9, the generator 202a is interconnected with the node A and the node B. A thermal power generator named G1 having a rating capacity of 100 is interconnected with the node A, and a wind power generator named G2 having a rating capacity of 200 is interconnected with the node B.

Moreover, in the example of FIG. 9, the electric power load 202b is interconnected with the node AA and the node BB. A house named L1 having a rating capacity of 1000 is interconnected with the node AA, and a factory named L2 having a rating capacity of 2000 is interconnected with the node BB.

Moreover, in the example of FIG. 9, a phase modifier 202C is interconnected with the node AAA and the node BBB. An SC (Static Condenser) named D1 having a rating capacity of 10 is interconnected with the node AAA, and a ShR (Shunt Reactor) named D2 having a rating capacity of 20 is interconnected with the node BBB.

FIG. 10 is a diagram showing the power line information table TB4 storing the power line information D2 among the data of the equipment information database DB.

The power line information D2 includes a power line name 300 for identifying the power line for each power line in the power system, end nodes 301 indicating the nodes on either end of the power line, and a normal phase resistance 302a, a normal phase reactance 302b, and a normal phase capacitance 302c of the power line. In the example of FIG. 10, the power line a exists between the node A and the node B, the normal phase resistance of the power line a is 0.01, the normal phase reactance is 0.2, and the normal phase capacitance is 0.1. Moreover, the power line b exists between the node B and the node C, and the normal phase resistance of the power line b is 0.02, the normal phase reactance is 0.5, and the normal phase capacitance is 0.2.

FIG. 11 is a diagram showing the measurement equipment information table TB5 storing the measurement equipment information D3 among the data of the equipment information database DB.

The measurement equipment information table TB5 includes measurement equipment information, identifying information of two measurement points 400*a*, 400*b* for each measurement point within the power system, and an inter-measurement point distance 403 between the foregoing points. Here, a measurement point indicates a point where the measurement device 21 is connected. In the example of the table TB5 of FIG. 11, the identifying information of the measurement points 400*a*, 400*b* includes measurement point names 401*a*, 401*b* showing the measurement device 21, and node names 402*a*, 402*b* included in the node information. The measurement point having the measurement point name of PMU 1 is connected to the node A, and the measurement point having the measurement point name of PMU 2 is connected to the node B.

Moreover, the inter-measurement point distance is a value that is calculated based on the electrical distance between the two measurement points, and the system elements such as the generator, the electric power load, and the phase modifier that are interconnected near the two measurement points. For example, the inter-measurement point distance D is calculated based on Formula (14) below. Note that Formula (14) is the definitional equation of the inter-measurement point distance D.

[Math 14]

$$D = \alpha d + \sum_{i=1}^{n} \beta_i C_i \quad (14)$$

Here, D represents the electrical distance that is proportional to the impedance between the two measurement points. n represents the number of system elements such as the generator, the electric power load, and the phase modifier that are interconnected from either of the two measurement points within a range of the electrical distance defined based on a certain threshold. Moreover, $C_i$ represents the rating capacity of the i-th system element that is interconnected from either of the two measurement points within a range of the electrical distance defined based on a certain threshold. $\alpha$, $\beta_i$ represent coefficients. By using the electrical distance between two measurement points, it is possible to determine whether the oscillation component of the two measurement points is the same.

The data configuration shown in the diagrams of the equipment information database DB is merely an example, and the information storage unit 30 may also store detailed equipment information. For example, the node information D1 may also include, as information of the node to which the thermal power generator is interconnected, generator dynamic characteristics such as a governor constant. Moreover, the node information D1 may also include, as information of the node to which a generator based on natural energy such as a wind power generator is interconnected, probabilistic electric power generation fluctuation characteristics calculated based on statistical analysis by using past history.

Moreover, upon calculating the inter-measurement point distance D in the measurement equipment information D3, the oscillation detection unit 12 may also prescribe the coefficient $\beta_i$ of Formula (1) based on the foregoing generator dynamic characteristics. Furthermore, the oscillation detection unit 12 may also calculate the distance between the measurement points by using the latitude/longitude information included in the node information without using the information of impedance or system elements such as the generator, the electric power load, and the phase modifier, and use the obtained value as the inter-measurement point distance D.

In the next processing step S116 of FIG. 8, the oscillation detection unit 12 determines whether the inter-measurement point distance has been calculated regarding all two-point combinations in relation to the measurement points of the measurement information acquired by the measurement information collection unit 11. When it is determined that the inter-measurement point distance has been calculated regarding all two-point combinations (Yes), the oscillation detection unit 12 ends the inter-measurement point distance calculation processing. When there is a combination of measurement points in which the inter-measurement point distance has not been calculated (No), the oscillation detection unit 12 repeats processing step S114 and processing step S115 regarding different two measurement points. Based on the foregoing processing, the inter-measurement point distance is calculated regarding all combinations of two measurement points.

The explanation is continued by returning to the oscillation influenced point extraction processing of FIG. 6. In the processing flow of FIG. 6, after the inter-measurement point distance is calculated (processing step S112), the oscillation detection unit 12 classifies the frequency oscillation information obtained in processing step S111 based on the inter-measurement point distance, and stores the result as area oscillation information in the information storage unit 30 (processing step S113). Here, the oscillation detection unit 12 may also classify the frequency oscillation information by using a clustering method as represented by the Ward method and the k-means method based on the inter-measurement point distance for each frequency oscillation information (oscillation frequency).

FIG. 12 is a diagram showing an example of the area oscillation information table TB6 obtained with the processing of processing step S113. As evident from the area oscillation information table TB6 of FIG. 12, the frequency oscillation information table TB2 is obtained as a result of adding the measurement point name 401 of the measurement equipment information table TB5 of FIG. 11 to the frequency oscillation information table TB2 of FIG. 7, and summarized with the oscillation number 500.

The area oscillation information table TB6 of FIG. 12 is now explained in further detail. The area oscillation information table TB6 includes the entry of each area oscillation information classified based on the inter-measurement point distance. The entry corresponding to one area oscillation information includes the oscillation number 500 (No.) indicating the oscillation component represented by the area oscillation information, the oscillation frequency 102 of the frequency oscillation information corresponding to the area oscillation information, the measurement point name 102 indicating the measurement point of the frequency oscillation information corresponding to the area oscillation information, and the oscillation characteristics 101 indicating the characteristics of the oscillation component. The oscillation characteristics 101 include the attenuation coefficient 103, the amplitude 104, and the initial phase 105 as with the oscillation characteristics (FIG. 7) of the frequency oscillation information.

In the example of FIG. 12, the detected oscillation information having an oscillation frequency of 0.18 observed at the measurement point PMU 1 and the detected oscillation information similarly having an oscillation frequency of 0.18 observed at the measurement point PMU 3 are mutually classified in different area oscillation information. This is because the inter-measurement point distance between the measurement point PMU 1 and the measurement point PMU 3 is relatively greater in comparison to other inter-measurement point distances. Accordingly, the frequency oscillation information is classified by using the stored information of the equipment information database DB.

When the difference of the oscillation frequencies of the oscillation components detected at a plurality of measurement points is within a predetermined range, by classifying the plurality of measurement points with the electrical distance between the plurality of measurement points based on the stored information of the equipment information database DB, and extracting the measurement points belonging to the respective classifications as the measurement point group, it is possible to identify the area where the respective oscillation components exist.

Figure 13:
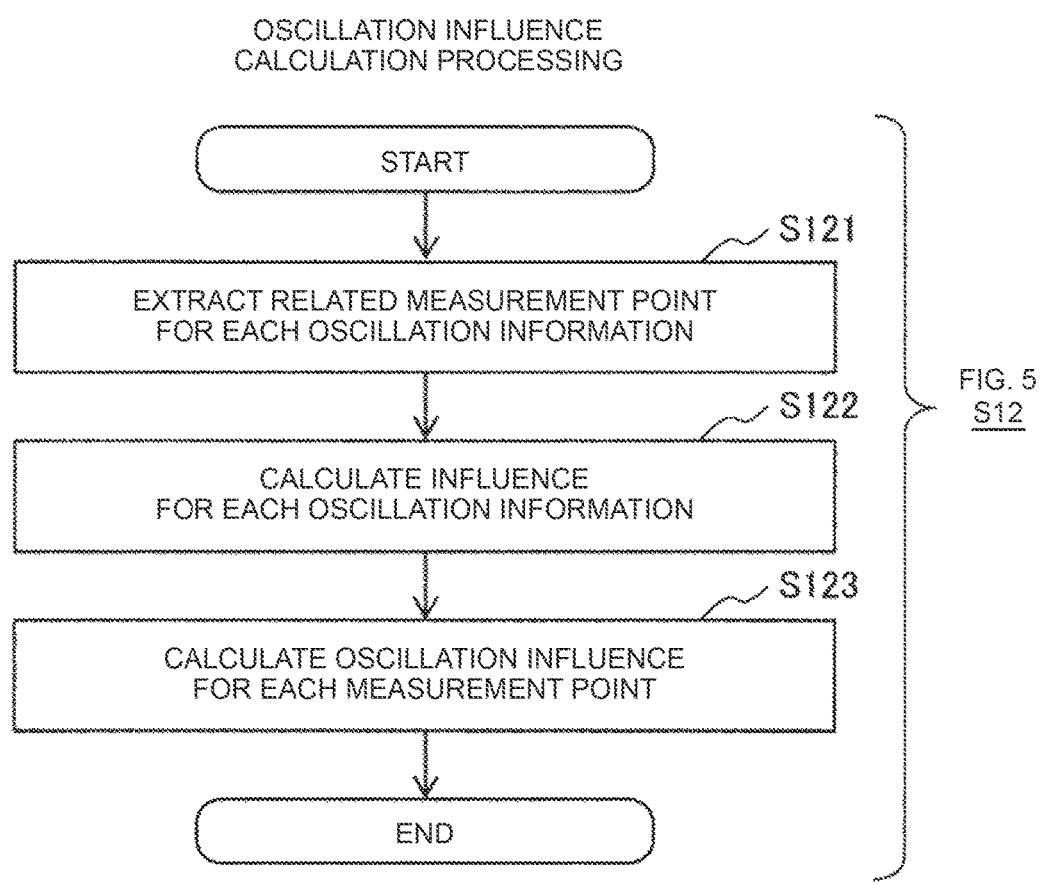
FIG. 13 is a diagram showing the specific flowchart of the oscillation influence calculation processing.

In the oscillation influence estimation processing of FIG. 5, in processing step S12, the oscillation influence calculation processing for calculating the oscillation influence by using the area oscillation information of FIG. 12 after processing step S11. FIG. 13 is a diagram showing the specific flowchart of the oscillation influence calculation processing.

Foremost, in processing step S121 of the oscillation detection unit 12, the measurement points included in the area oscillation information for each area oscillation information arranged as shown in FIG. 12 are extracted. For instance, to explain using the example of the area oscillation information table TB6 of FIG. 12, the oscillation detection unit 12 foremost refers to "1" regarding the oscillation number 500, and extracts "PMU 1", "PMU 3" and so on as the measurement points 401 where the oscillation frequency 102 detected the oscillation component of "0.18". Similarly, the oscillation detection unit 12 refers to "2" regarding the oscillation number 500, and extracts "PMU 1" and so on as the measurement points 401 where the oscillation frequency 102 detected the oscillation component of "0.65". Similarly, the oscillation detection unit 12 refers to "3" regarding the oscillation number 500, and extracts "PMU 2" and so on as the measurement points 401 where the oscillation frequency 102 detected the oscillation component of "0.18".

Next, in processing step S122 of the oscillation detection unit 12, the oscillation influence of each area oscillation information is calculated from the oscillation characteristics corresponding to the measurement points extracted in processing step S114 of FIG. 8. By calculating the oscillation influence, it is possible to express the size of influence that each oscillation component has on the stability of the power system.

Figure 14:
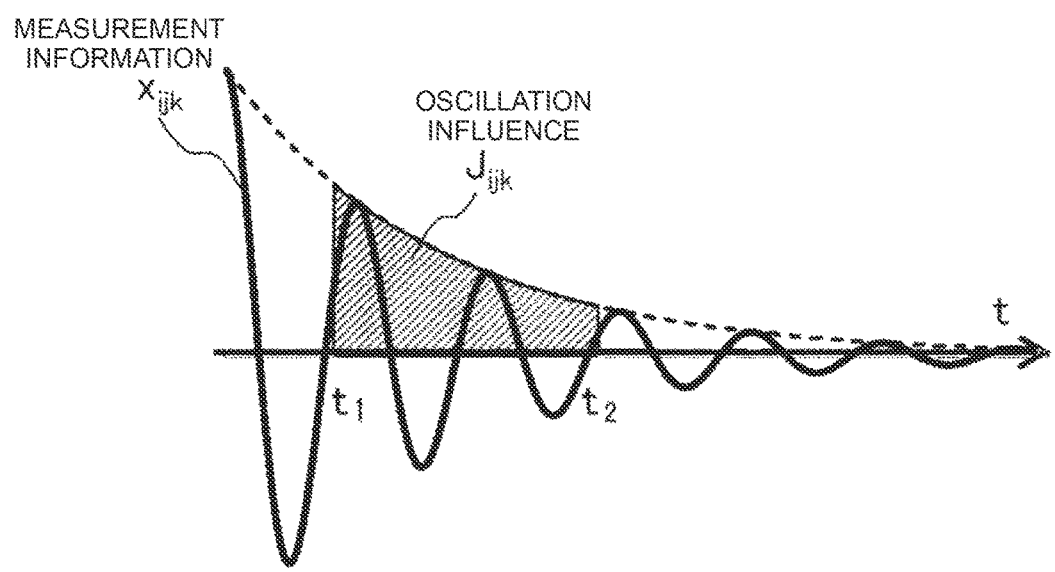
FIG. 14 is a diagram showing the concept of the oscillation influence calculation processing.

The concept of the oscillation influence calculation processing is now explained with reference to FIG. 14. In FIG. 14, the horizontal axis takes on the time, and the vertical axis takes on the measurement information $x_{ijk}$ and the oscillation influence $J_{ijk}$ obtained from the measurement information. This example shows a cases where the electric power fluctuation undergoes damped vibration together with the lapse of time. FIG. 14 is now explained in further detail.

In FIG. 14, $J_{ijk}$ represents the area oscillation information j of the measurement point i and the oscillation influence of the measurement type k, $x_{ijk}$ represents the area oscillation information j at the measurement point i and the measurement information of the measurement type k, t1, t2 (t1<t2) represents the time that is designated in advance, $B_{ijk}$ represents the amplitude (104 of FIG. 12) of the oscillation calculated based on Formula (12), and $a_{ijk}$ represents the attenuation coefficient (103 of FIG. 12) calculated based on Formula (7).

The oscillation detection unit 12 calculates the oscillation influence $J_{ijk}$ of each area oscillation information based on Formula (15). Note that Formula (15) is the definitional equation of the oscillation influence J.

[Math 15]

$$J_{ijk} = \int_{t1}^{t2} |B_{ijk}\exp(\sigma_{ijk}t)|dt \qquad (15)$$
$$= \frac{|B_{ijk}|\{\exp(\sigma_{ijk}t_2) - \exp(\sigma_{ijk}t_1)\}}{\sigma_{ijk}}$$

Here, when the time to be used as the reference of analysis is defined as 0, and 0>t2>t1 is set, the oscillation influence $J_{ijk}$ of the past area oscillation information is calculated based on the analysis reference time. Similarly, when t2>0>t1 is set, the oscillation influence $J_{ijk}$ of the current area oscillation information including the analysis reference time is calculated, and when t2>t1>0 is set, the oscillation influence $J_{ijk}$ of the future area oscillation information is calculated based on the analysis reference time.

For example, by setting t2>t1>0, the time change of the future oscillation component at a given measurement point is predicted, the oscillation influence $J_{ijk}$ is calculated based on the predicted oscillation component, and it is thereby possible to determine whether that measurement point will become unstable in the future based on the oscillation influence $J_{ijk}$. By using the amplitude $B_{ijk}$ and the attenuation coefficient $\sigma_{ijk}$ as the oscillation influence $J_{ijk}$, it is possible to predict the future oscillation influence $J_{ijk}$.

By calculating the oscillation influence $J_{ijk}$ based on the definition of Formula (15), the oscillation influence of the area oscillation information in which the amplitude $B_{ijk}$ is large and the attenuation coefficient $\sigma_{ijk}$ is inferior (attenuation coefficient $v_{ijk}$ is large) will increase. Here, in substitute of the oscillation influence based on Formula (15), the value of the amplitude $B_{ijk}$ or the attenuation coefficient $\sigma_{ijk}$ itself may also be defined as the oscillation influence.

Moreover, in the processing of the oscillation detection unit 12, it is also possible to refer to the past area oscillation information, select the past area oscillation information corresponding to the state of the measurement point group of the current area oscillation information among the past area oscillation information, and calculate the oscillation influence $J_{ijk}$ by giving consideration to the duration of the oscillation components of the selected past area oscillation information.

For example, the oscillation detection unit 12 may also set the oscillation influence $J_{ijk}$ to be great when the period that the oscillation component having the same oscillation frequency continues to exist is equal to or greater than a predetermined period threshold in the past area oscillation information, and set the oscillation influence $J_{ijk}$ to be small when the period that the oscillation component having the same oscillation frequency continues to exist is a predetermined period threshold or less in the past area oscillation information. As a result of setting the oscillation influence as described above, it is possible to eliminate oscillation caused by the influence of noise that is instantaneously included in the system oscillation, and preferentially monitor the oscillation components existing in a steady state.

FIG. 15 is a diagram showing an example of the past oscillation information table TB7. As evident upon comparing the past oscillation information table TB7 of FIG. 15 and the area oscillation information table TB6 of FIG. 12, the past oscillation information table TB7 is obtained by additionally assigning information such as the oscillation influence and case details and organizing such information.

The past oscillation information table TB7 is now explained in further detail. The past oscillation information table TB7 includes an entry for each case. An entry of one case include the case details 600 indicating the case, and at least one area oscillation information corresponding to the case. The case details 600 include a time 601, a date or day 602, a month or season 603, and an event type 604. The area oscillation information includes an oscillation number 500, an oscillation frequency 102, an oscillation influence 605, a measurement point 401, an attenuation coefficient 103, an amplitude 104, and an initial phase 105.

The oscillation detection unit 12 classifies the past area oscillation information for each case, and stores the information that underwent statistical processing as the past oscillation information table TB7 in the information storage unit 30. The oscillation detection unit 12 sets the case based on information such as the time, date, day, month, season, and event type of the measurement information that used for calculating the detected oscillation information.

By setting the case using the time 601, the oscillation detection unit 12 can reflect the fluctuation influence of the tidal current state within the system during one day on the statistical processing of the area oscillation information. Fluctuation of the tidal current state in the foregoing case is caused by the living activities during one day when taking the work hours, which are differentiated based on the morning work start time and the evening work end time as one example. In the example of FIG. 15, 8:00-10:00 is set in case No. 1, and 12:00-14:00 is set in case No. 2.

By setting the case using the date or day 602, the oscillation detection unit 12 can reflect the fluctuation influence of the tidal current state within the system during one week on the statistical processing of the area oscillation information. Fluctuation of the tidal current state in the foregoing case is caused by the daily living activities when taking weekdays and holidays as one example. In the example of FIG. 15, Saturday and Sunday are set in case No. 1, and Monday through Friday are set in case No. 2.

By setting the case using the month or season 603, the oscillation detection unit 12 can reflect the fluctuation influence of the tidal current state within the system during one year on the statistical processing of the area oscillation information. Fluctuation of the tidal current state in the foregoing case is caused by the living activities of each month or season when taking the cooling demand in the summer and the heating demand in the winter are as one example. In the example of FIG. 15, March to May are set in case No. 1 and July to September are set in case No. 2.

By setting the case using the event type 604, the oscillation detection unit 12 can reflect the fluctuation influence of the tidal current state within the system based on an event such as a system malfunction or system switching on the statistical processing of the area oscillation information. In the example of FIG. 15, no event is set in case No. 1 and 1LG of the node AA is set in the case No. 2.

While not illustrated in FIG. 15, the oscillation detection unit 12 may set a case, in addition to the setting methods of the case described above, with the tidal current amount of the nodes or power lines set in advance as the monitoring target, the electric power generation of the generator, weather information including classification of sunny, cloudy or rain or temperature information as classification items, and then perform the statistical processing of the area oscillation information.

Figure 16:
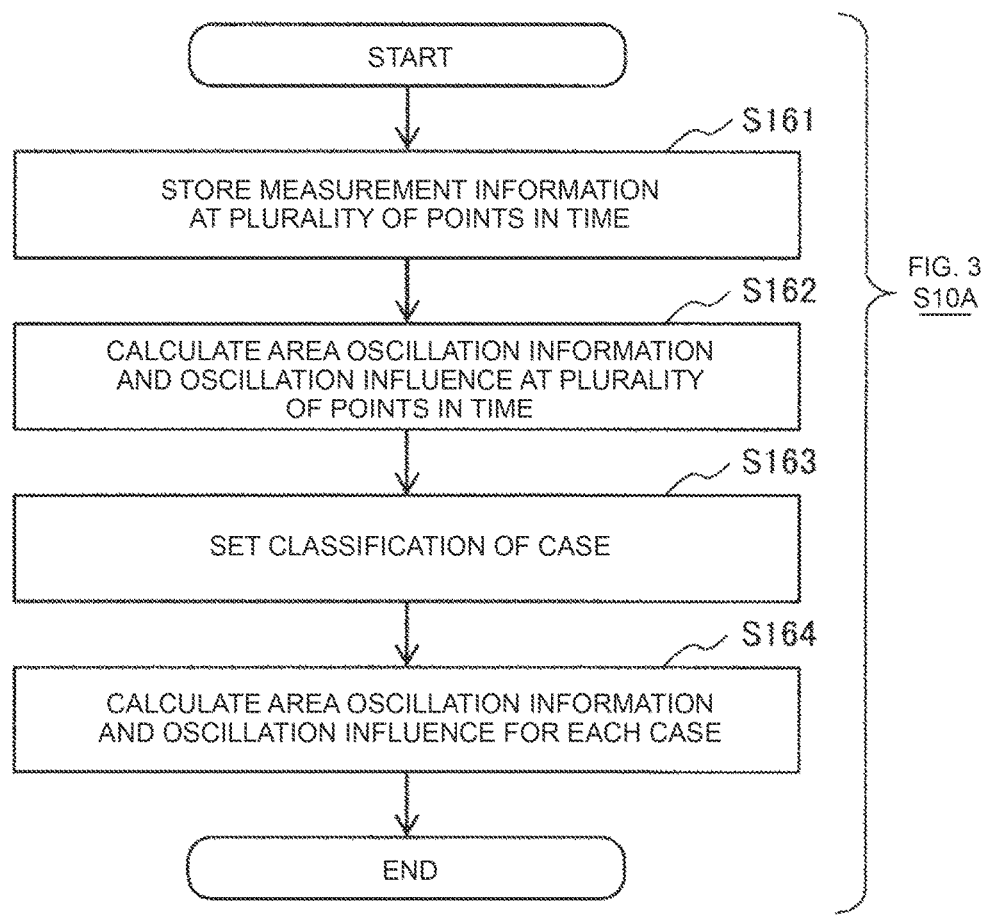
FIG. 16 is a diagram showing a flowchart illustrating the past oscillation information calculation processing.

Here, the past oscillation information calculation processing in which the oscillation detection unit 12 calculates the past oscillation information table TB7 of FIG. 15 is now explained. FIG. 16 is an example of the flowchart showing the past oscillation information calculation processing. Note that the processing flow of FIG. 16 is executed by being positioned at the latter part of the oscillation influence estimation processing flow of FIG. 5.

In FIG. 16, the oscillation detection unit 12 foremost stores the measurement information of a plurality of points in time in processing step S161.

Next, the oscillation detection unit 12 calculates the area oscillation information at a plurality of points in time and the oscillation influence thereof by using the measurement information stored in processing step S162. Here, the oscillation detection unit 12 calculates the real oscillation information and the oscillation influence thereof according the steps of processing steps S11 to S12 of FIG. 5 described above.

Next, the oscillation detection unit 12 sets the classification of the case in processing step S163. Here, the oscillation detection unit 12 uses, as the classification items, at least one among the information of time, date, day, month, season, and event type indicated in the past oscillation information. The oscillation detection unit 12 determines the start and end of the period, classification name of the event type, or minimum value/maximum value of the numerical value information with regard to the respective classification items to be used, and then sets the classification category.

Next, in processing step S164 of the oscillation detection unit 12, the area oscillation information and oscillation influence of each case are calculated based on the classification of the case set in processing step S161. Here, the oscillation detection unit 12 classifies the analysis time that the area oscillation information and oscillation influence calculated in processing step S162 for each case, and uses, as the area oscillation information and oscillation influence of each case, the representative value calculated by performing statistical processing to the area oscillation information and the oscillation influence information at a plurality of times that were classified as the same case. The oscillation detection unit 12 uses, as the representative value, the average value and the intermediate value for each area oscillation information and oscillation influence.

The past oscillation information calculation processing is as described above. Note that, in the oscillation influence calculation processing, the oscillation detection unit 12 may refer to the past oscillation information calculated based on the past oscillation information calculation processing, extract the case closest to the state of the analysis time, and apply the oscillation influence of the extracted case. By using the statistical processing results of the past area oscillation information, the oscillation detection unit 12 can eliminate the oscillation caused by the influence of instantaneous noise included in the system oscillation at the analysis time, and accurately select the oscillation component to be monitored preferentially.

Note that, after processing step S122 of FIG. 13, the oscillation detection unit 12 in processing step S123 calculates the oscillation influence $J_{ij}$ of the area oscillation information j at the measurement point i according to Formula (16). Formula (16) is the definitional equation of the oscillation influence J in consideration of a plurality of types. Here, $\beta_k$ of Formula (16) is the coefficient that is set to the measurement information type k. $\beta_k$ may also be the inverse of the rating value of each measurement type k. The oscillation detection unit 12 can calculate the oscillation influence in the measurement information of a plurality of types by normalizing it at a ratio relative to the rating by using the rating value of each measurement type. Moreover, in order to extract the oscillation influence of a specific measurement type, the value of the coefficient $\beta_k$ corresponding to the measurement type k may be set to be greater in comparison to the coefficient relative to the other types.

[Math 16]

$$Jij = \Sigma Jijk \cdot \beta k \qquad (16)$$

Furthermore, the oscillation detection unit 12 may also calculate the oscillation influence $J_i$, which gives consideration to all area oscillation information at the measurement point i, based on Formula (17) below. Formula (17) is the definitional equation of the oscillation influence J giving consideration to the area where the oscillation was generated. Here, $\gamma_j$ is the coefficient that is set to the area oscillation information j. By increasing the coefficient $\gamma_j$ to certain area oscillation information j, it is possible to calculate the oscillation influence which emphasizes the specific area oscillation information.

[Math 17]

$$Ji = \Sigma Jij \cdot \gamma j \qquad (17)$$

As described above, the oscillation influence $J_{ij}$ of the area oscillation information j at the measurement point i or the oscillation influence $J_i$ at the measurement point i is calculated based on the oscillation influence calculation processing of FIG. 13. The explanation up to this point relates to the processing contents of the oscillation detection unit 12 of FIG. 1, and therefore the processing contents in processing step S10 of FIG. 3.

Next, the processing contents of the control priority determining unit 13 of FIG. 1, and therefore the processing contents in processing step S20 of FIG. 3, are now explained. In processing step S20 of FIG. 3, the priority for each control instrument is determined based on the data stored in the equipment information database DB.

An example of the mathematical formula for calculating the control priority is shown in Formula (18). Formula (18) is the definitional equation of the control priority L. Note that Lij represents the control priority of the control means j based on the control instrument i, pij represents the controllable variable based on the control means j of the control instrument i, qij represents the level of the control effect based on the control means j of the control instrument i, and a1, a2 represent the coefficients set in advance.

[Math 18]

$$Lij = a1 \cdot pij + a2 \cdot qij \qquad (18)$$

Here, the control target instrument (hereinafter simply referred to as the "control instrument") i may also include a generator, a load, a phase modifier, a transformer, and a switching device. The control means j may also include generator dropping, generator invalid power control, load shedding, phase modification control, tap control, and system switching. The controllable variable pij may be determined based on the current output of the generator, current power consumption of the load, phase modifier capacity, and current tidal current amount flowing in the switching device. qij may be set large when the control speed is fast (when the constant is small during operation) and set small when the control speed is slow (when the constant is large during operation) based on the control speed (constant during operation) of the control means j of the control instrument i.

Moreover, qij may also be set based on a combination of the destabilization phenomenon to be stabilized and the control means j of the control instrument i. For example, when stabilizing the destabilization phenomenon caused by an unbalanced valid power, qij of the control means such as generator dropping, load shedding, and system switching, which considerably influence the valid power tidal current, may also be set to be large.

As a result of calculating the control priority Lij as described above, it is possible to perform stabilization control based on the control performance of the control means by using the data stored in the equipment database DB.

Figure 17:
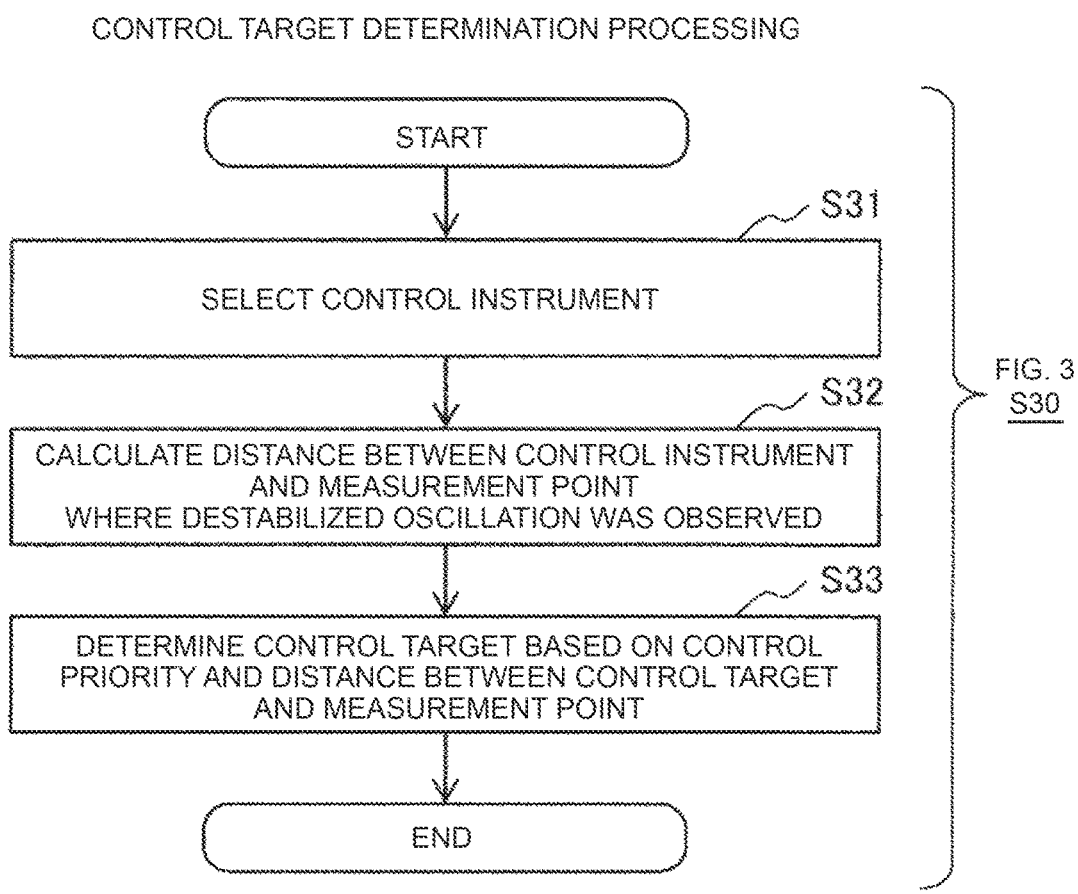
FIG. 17 is a diagram showing the flow of the control target determination processing.

Once again returning to FIG. 1 and FIG. 3, next, in processing step S30 of the control target determining unit 14, the control target is based on the detected oscillation information and the control priority. FIG. 17 shows the flow of the control target determination processing.

In the control target determination processing of FIG. 17, foremost, in the first processing step S31, one control instrument, in which the control priority was calculated, is selected.

Next, in processing step S32, the distance between the selected control instrument and all measurement points where unstable oscillation was observed is calculated. The distance between points is the value that is calculated based on the electrical distance between the interconnected points of the control instruments and the measurement points, and the system elements such as the generator, the electric power load, and the phase modifier that are interconnected near the interconnected points of the control instruments and the measurement points. For example, the distance D between points calculated based on Formula (14) may be used.

Next, in processing step S33, the control target is determined based on the control priority and the distance between the control target and the measurement points. For example, the control effect L'ij shown in Formula (19) below is calculated for each control means, and the control means with the maximum L'ij may also be selected. Note that Formula (19) is the definitional equation of the control effect L'ij. Here, the control effect Lij represents the control priority of the control means j based on the control instrument i, Di represents the distance between the control instrument i and the measurement points where an unstable oscillation was observed as calculated in processing step S32, and b1, b2 represent the coefficients set in advance.

[Math 19]

$$L'ij = b1 \cdot Lij - b2 \cdot Di \qquad (19)$$

Here, the control instrument i may also include a generator, a load, a phase modifier, a transformer, and a switching device. The control means j may also include generator dropping, generator invalid power control, load shedding, phase modification control, tap control, and system switching. Di may also be the minimum value among the distances between the control instrument i and the measurement points where an unstable oscillation was observed as calculated in processing step S32.

By repeating the processing shown in processing step S31 to processing step S33 regarding all control instruments, the control effect L'ij regarding all control instruments is calculated, and the control means with the maximum L'ij is selected.

By determining the control target with a high control effect as a result of having a high control performance and being close to the point where the oscillation was generated as described above, the system can be stabilized with few controlled variables.

Here, the control priority may be calculated and the control target may be determined with a combination of a plurality of control instruments as one control. Here, when the upper limit of the controlled variable is set in advance, only the control instruments in which the sum of the controlled variables of a plurality of control instruments is less than the controlled variable upper limit may be set as the control target. Consequently, because it is possible to limit the controlled variables to be within a given range, it is possible to suppress excessive control of controlling even the control instruments that are not required for the stabilization.

Figure 18:
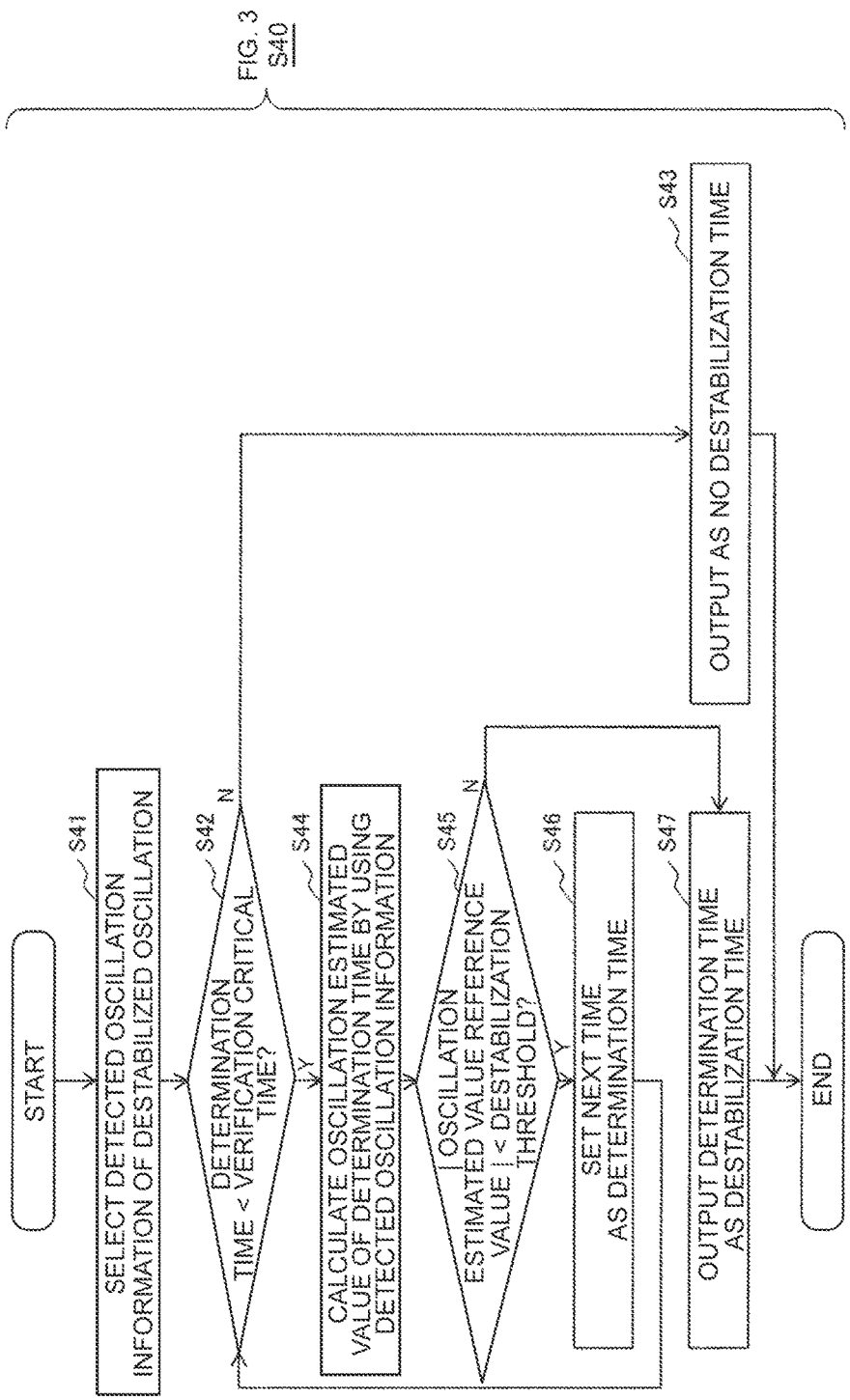
FIG. 18 is a diagram showing the flow of the destabilization time calculation processing.

Once again returning to FIG. 1 and FIG. 3, next, in processing step S40 of the destabilization time calculating unit 15, the destabilization time is calculated based on the detected oscillation information. FIG. 18 shows the flow of the destabilization time calculation processing.

FIG. 18 shows the flow of the destabilization time calculation processing.

In the first processing step S41 of the destabilization time calculation processing flow of FIG. 18, one detected oscillation information of an unstable oscillation is selected. Next, in processing step S42, the determination time of the current time onward is set, and whether the determination time is before the verification critical time, which was set in advance, is determined. When the determination time is after the verification critical time (N of processing step S42 in FIG. 18), the result of "no destabilization time" is output (processing step S43), and the destabilization time calculation processing is ended. When the determination time is before the verification critical time (Y of processing step S42 in FIG. 18), the oscillation estimated value of the determination time is calculated by using the detected oscillation information (processing step S44). Here, the oscillation estimated value may also be calculated based on Formula (20) below.

[Math 20]

$$y(t) = \Sigma R_i \exp(j\theta_i)\exp((\sigma_i + 2\pi f_i)t) \quad (20)$$

Here, y(t) represents the estimated value, t represents the determination time, i represents the index of the oscillation information, Ri represents the amplitude of the oscillation information i, θi represents the initial phase of the oscillation information i, σi represents the attenuation coefficient of the oscillation information i, and fi represents the oscillation frequency of the oscillation information i.

Next, in processing step S45, whether the difference between the calculated oscillation estimated value and the pre-set reference value is smaller than the pre-set unstable threshold. Here, an average value of the measured values of a certain fixed period or the steady-state value may be used as a reference value. When the foregoing difference is smaller than the unstable threshold (Y of processing step S45 in FIG. 18), the time that the pre-set time interval has elapsed is set as the determination time (processing step S46), and the process returns to the processing of processing step S42. When the foregoing difference is greater than the unstable threshold (N of processing step S45 in FIG. 18), the current determination time is output as the destabilization time (processing step S47), and the destabilization time calculation processing is ended.

The time that the oscillation estimated value will exceed the unstable threshold in the future can be calculated as described above.

Figure 19:
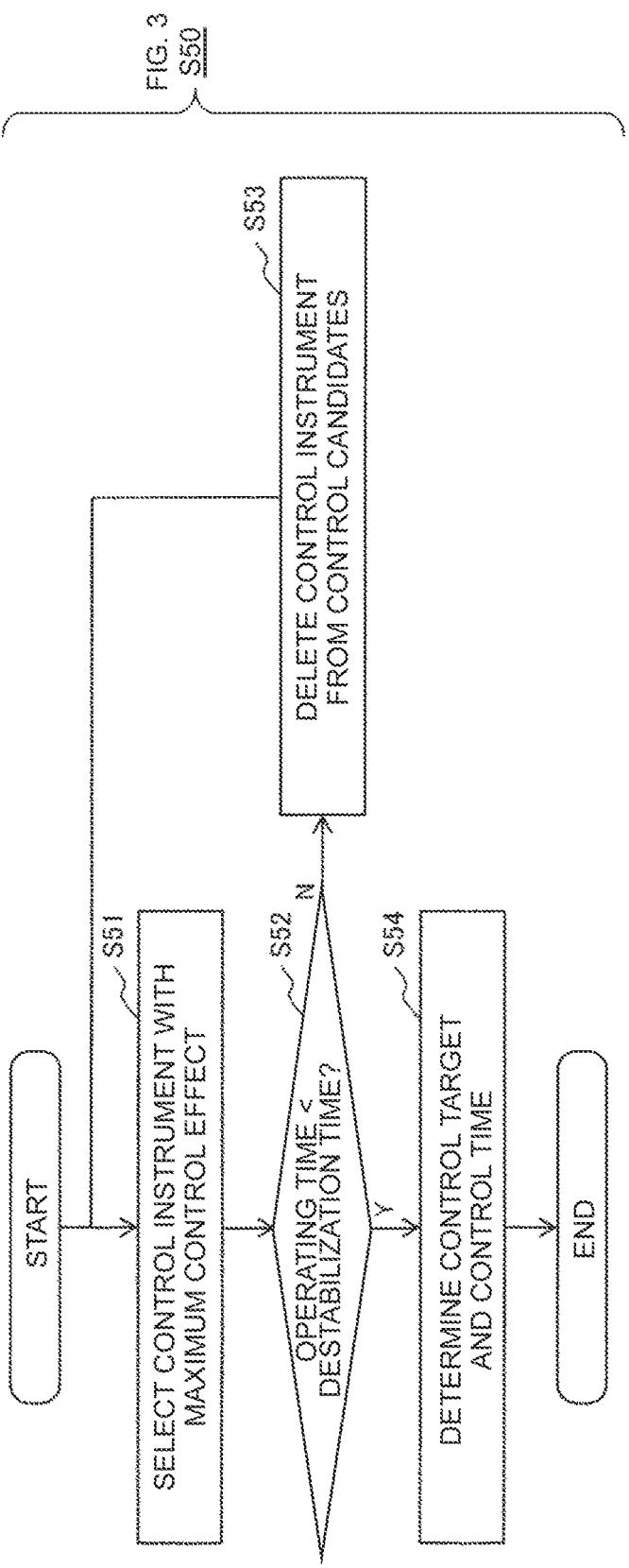
FIG. 19 is a diagram showing the flow of the control time determination processing.

Once again returning to FIG. 1 and FIG. 3, next, in processing step S50 of the control time determining unit 16, the control time is determined based on the destabilization time information and the control target information. FIG. 19 shows the flow of the control time determination processing.

In the first processing step S51 of the control time determination processing of FIG. 19, the control instrument with the maximum control effect is selected. Next, in processing step S52, whether the operating time of the selected control instrument is smaller than the calculated destabilization time is determined. When the operating time is greater than the destabilization time (N of processing step S52 in FIG. 19), the selected control instrument is deleted from the control candidates (processing step S53 in FIG. 19), the process returns to processing step S51, and the control instrument with the maximum control effect is selected among the remaining control candidates. When the operating time is smaller than the destabilization time (N of processing step S52 in FIG. 19), the selected control candidate is determined as the control target, and the operating time of the control instrument is set as the control time (processing step S54 in FIG. 19).

By selecting the control target that is controllable before the destabilization time and with a high control effect as described above, it is possible to select the control target that can be stabilized with minimum controlled variables. Here, a plurality of control plans in which the operating time will be shorter than the destabilization time may also be calculated.

Figure 20:
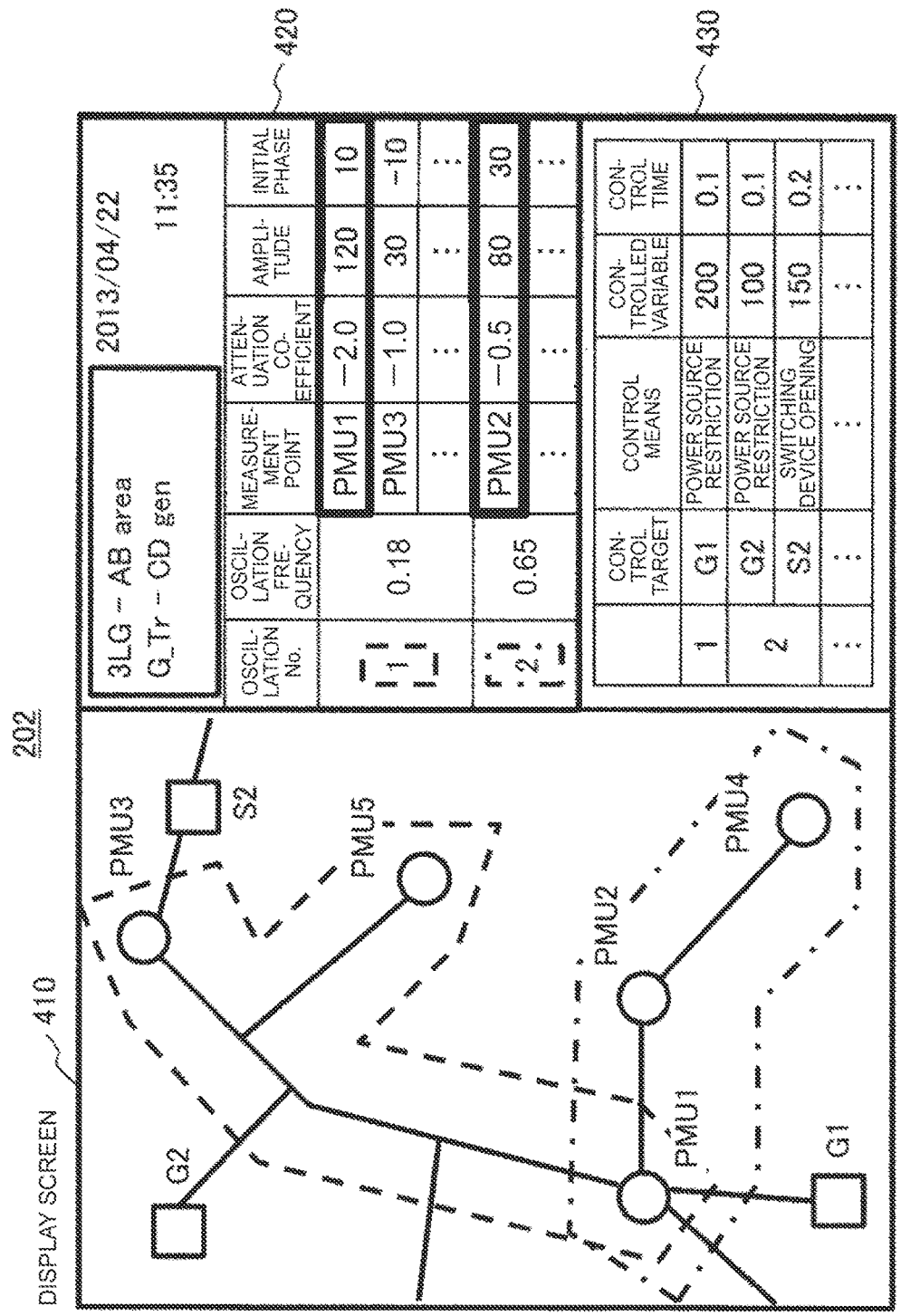
FIG. 20 is a diagram showing an example of the display screen.

The contents of the respective units and processing of FIG. 1 and FIG. 3 were explained above, and the processing stages and processing results are preferably displayed on the monitor screen as needed and provided to the user. FIG. 20 shows an example of the display screen. The display screen may use a plurality of monitors, or one monitor screen may be split into multiple screens to display a plurality of contents. Here, a screen splitting case is shown.

As the setting for using the monitor screen in this case, the processing of detecting the destabilization time is illustrated. For instance, the destabilization time detection unit 15 selects the area oscillation information with a high oscillation influence at a specific time. The destabilization time detection unit 15 displays, on the display device 202, the display screen showing the selected area oscillation information. The display screen differentiates and displays the measurement points included in the selected area oscillation information; for example, the measurement points are colored and displayed for each area oscillation information on the system diagram.

For example, the display screen displays the system diagram on the column 410 on the left side of the screen. The system diagram illustrates the generator G and the power distribution cable, and measurement points PMU 1 to PMU 5 are additionally displayed on the system diagram. The display screen additionally represents the measurement points included in each area oscillation information in an area surrounded by a dotted line or a dashed line based on the area oscillation information. In the example of FIG. 20, PMU 1, PMU 2, and PMU 4 are included in one area oscillation information, and PMU 1, PMU 3, and PMU 5 are included in another area oscillation information.

Moreover, the display screen additionally displays, in the column 420 on the upper right side, details of the area oscillation information, as well as the ground fault/short circuit malfunction information that occurred in neighboring regions that will influence a wide-area oscillation phenomenon, and the generator omission information. As details of the area oscillation information, the area oscillation information with a high oscillation influence is preferentially displayed. Furthermore, the display screen displays in order or priority, in the column 430 on the lower right side, the control target, the control means, the controlled variable, and the control time. When the operator (administrator) recognizes a current or future unstable point and the control candidate on the display screen, the operator (administrator) may issue a stabilization control instruction.

According to the foregoing embodiment, it is possible to realize high-speed and highly precise stabilization control even when the system state changes steeply and becomes destabilized due to system switching or renewable energy output fluctuation.

Embodiment 2

The system stabilization control device of Embodiment 1 was configured with the use as the control function for monitoring the state of the power system and determining the control target and control time during actual oscillation to achieve stabilization as the subject. Meanwhile, in Embodiment 2, the mode of use as an operator training simulator is explained.

Figure 21:
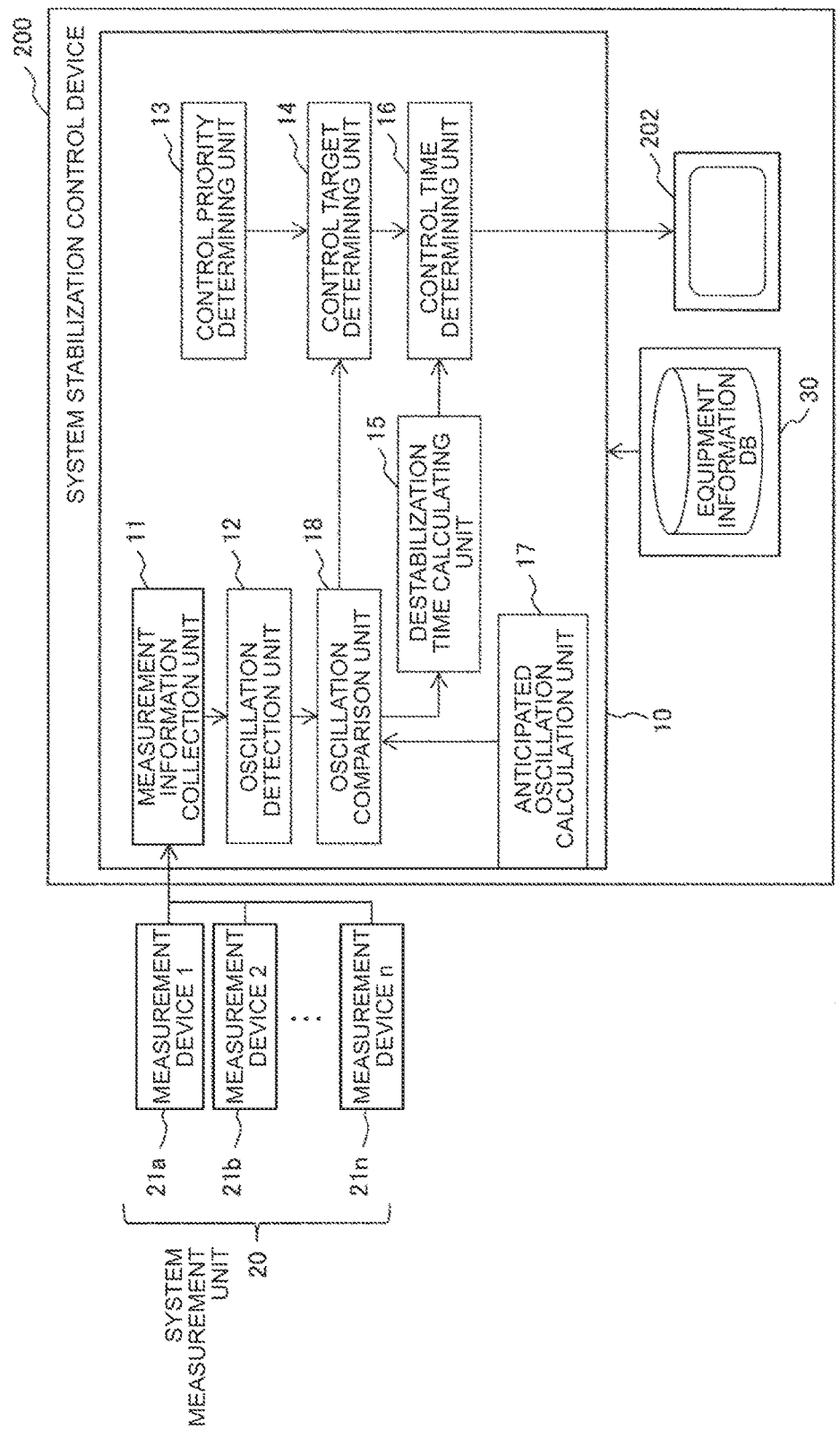
FIG. 21 is a diagram showing a configuration example of the system stabilization control device according to Embodiment 2.

The configuration of the system stabilization control device of FIG. 21 is basically the same as FIG. 1, but additionally comprises an anticipated oscillation calculating unit 17, and an oscillation comparison unit 18. Moreover, because the mode of use is as an operator training simulator, the system stabilization control device is configured so that settings can be input to the anticipated oscillation calculating unit 17 as needed, and configured so that it can be used by using the monitor 202 and the input operation instrument.

Figure 22:
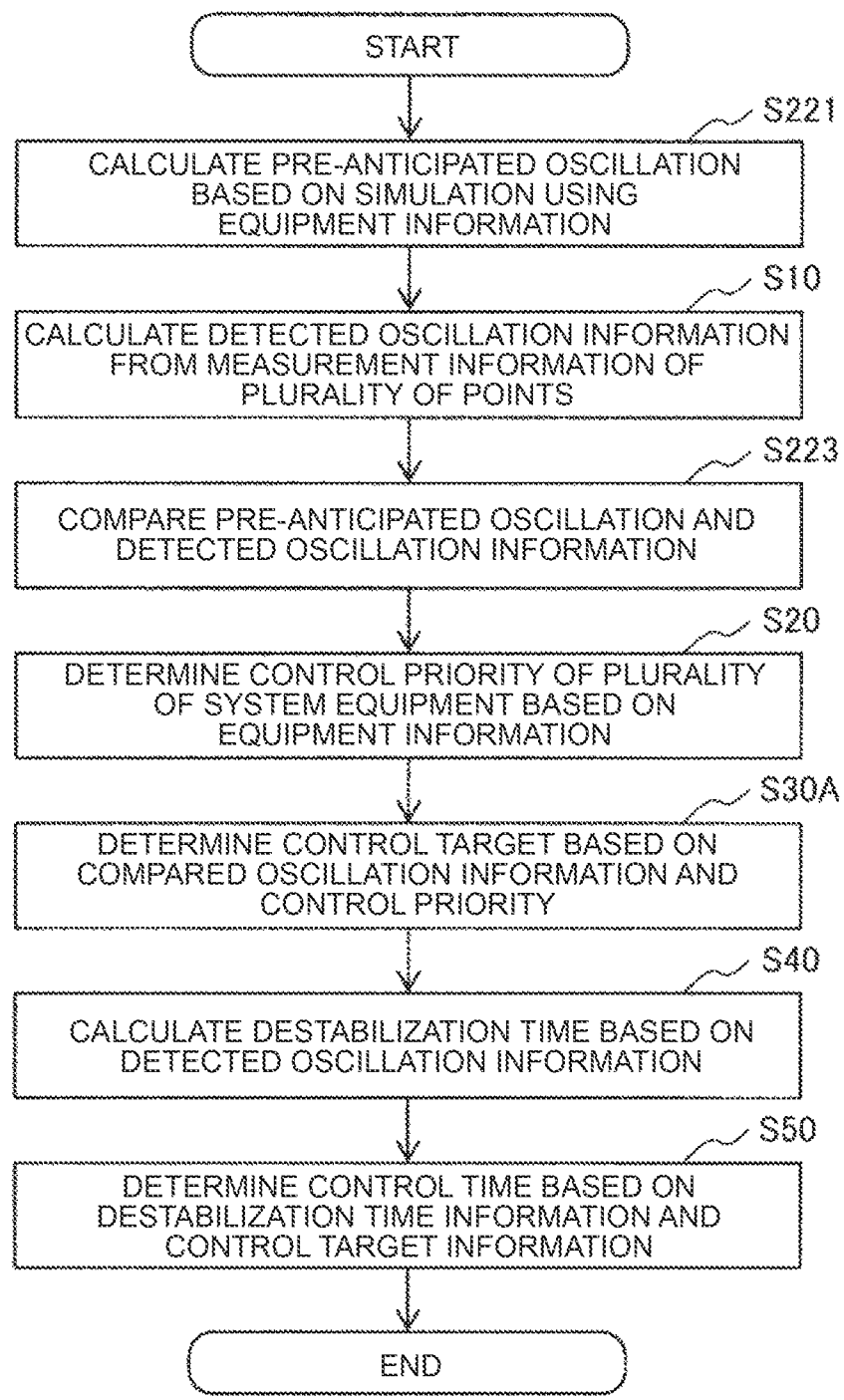
FIG. 22 is a diagram showing a flowchart of the system stabilization control determination processing according to Embodiment 2.

The flow of the system stabilization control determination processing shown in FIG. 22 is basically the same as FIG. 3, but differs in processing steps S221, S223, and S30A.

In processing step S221 (anticipated oscillation calculating unit 17), pre-anticipated oscillation is calculated based on simulation using equipment information. In this pre-anticipated oscillation, the generation location of the anticipated oscillation of the power system and the size of oscillation are calculated and set in advance.

In processing step S223, the pre-anticipated oscillation and the detected oscillation information are compared. Here, as the comparison result, for instance, information of the pre-anticipated oscillation is sent to the processing of the next stage onward. Otherwise, processing of reflecting the difference of the comparison result on various types of data and leveraging the same in subsequent processing may be performed. On the assumption that this system is normally used as an operator training simulator as needed while monitoring the system in real time and function as a system stabilization control device, as the significance of the comparison, processing of switching the functions or sending/receiving necessary data is executed.

Processing step S30A performs the same processing as processing step S30 of FIG. 3, but differs with regard to the point that the used data is the comparative oscillation information in substitute for the detected oscillation information.

According to the foregoing configuration, the system stabilization control device can be used as a device for performing training by inputting the trainee's correspondence to the instructors anticipated oscillation of the operator training simulator, and ultimately presenting the control target, control time and so on as the reply from processing step S50.

Embodiment 3

In the configuration of the system stabilization control device in Embodiment 1, the system stabilization control device 200 acquired information of the measurement device installed there from a partial area of the overall power system. Meanwhile, the configuration of FIG. 23 is obtained by adding an entire system stabilization control device 300 as a device configuration in cases where the a wider power system area is targeted.

Figure 23:
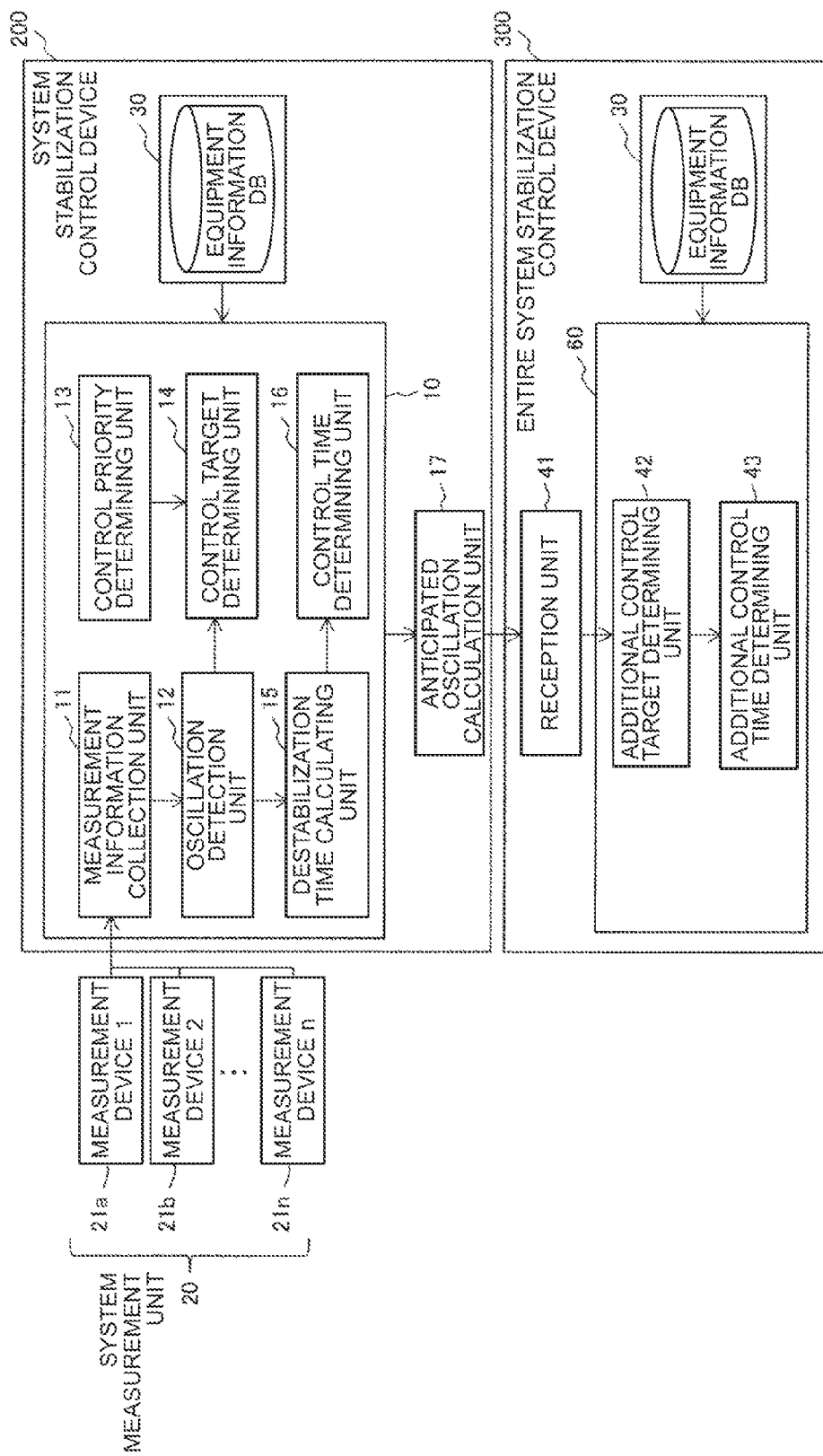
FIG. 23 is a diagram showing a configuration example of the system stabilization control device according to Embodiment 3.

In the configuration example of FIG. 23, the system stabilization control device 200 sets the power system of the power company A as the monitoring area, and the entire system stabilization control device 300 may set the monitoring target across a plurality of power companies. Otherwise, the system stabilization control device 200 sets the local power system of the power company A as the monitoring area, and the entire system stabilization control device 300 may be positioned as setting a wide-area power system of the power company as the monitoring target. Moreover, a plurality of system stabilization control devices 200 may be provided for each monitoring area, and the entire system stabilization control device 300 may be positioned at an upper level for monitoring the entire area.

In the configuration of FIG. 23, the system stabilization control device 200 comprises a transmission unit 17 and the entire system stabilization control device 300 comprises a reception unit 41, and information of the system stabilization control determining unit 10 is sent to the entire system stabilization control device 300.

The equipment information database DB in the entire system stabilization control device 300 retains equipment information of the entire area, and the system stabilization control addition determining unit 60 determines the control target to be additionally controlled by the additional control target determining unit 42 as a result of the determination in a wide area, and the additional control time in the foregoing case is determined by the additional control time determining unit. The additionally determined operational contents are sent to the system stabilization control determining unit 10 via the communication system as needed, and the additional operation is executed.

Figure 24:
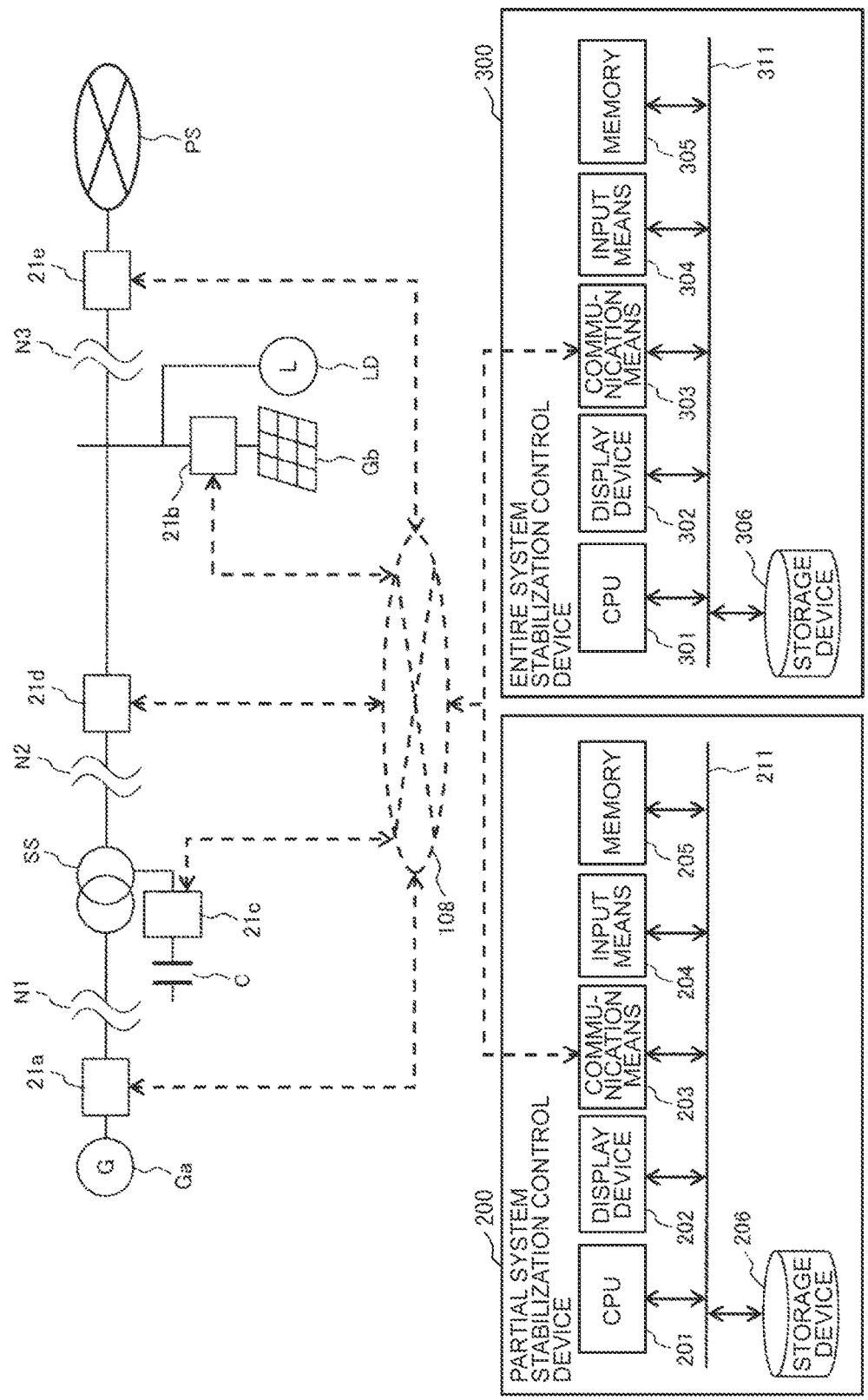
FIG. 24 is a diagram showing a configuration example of the power system control system according to Embodiment 3.

FIG. 24 shows the system configuration when FIG. 23 is realized. Note that, in the entire system stabilization control device 300, 301 represents a CPU, 302 represents a display device, 303 represents a communication means, 304 represents an input means, and 305 represents a memory.

Figure 25A:
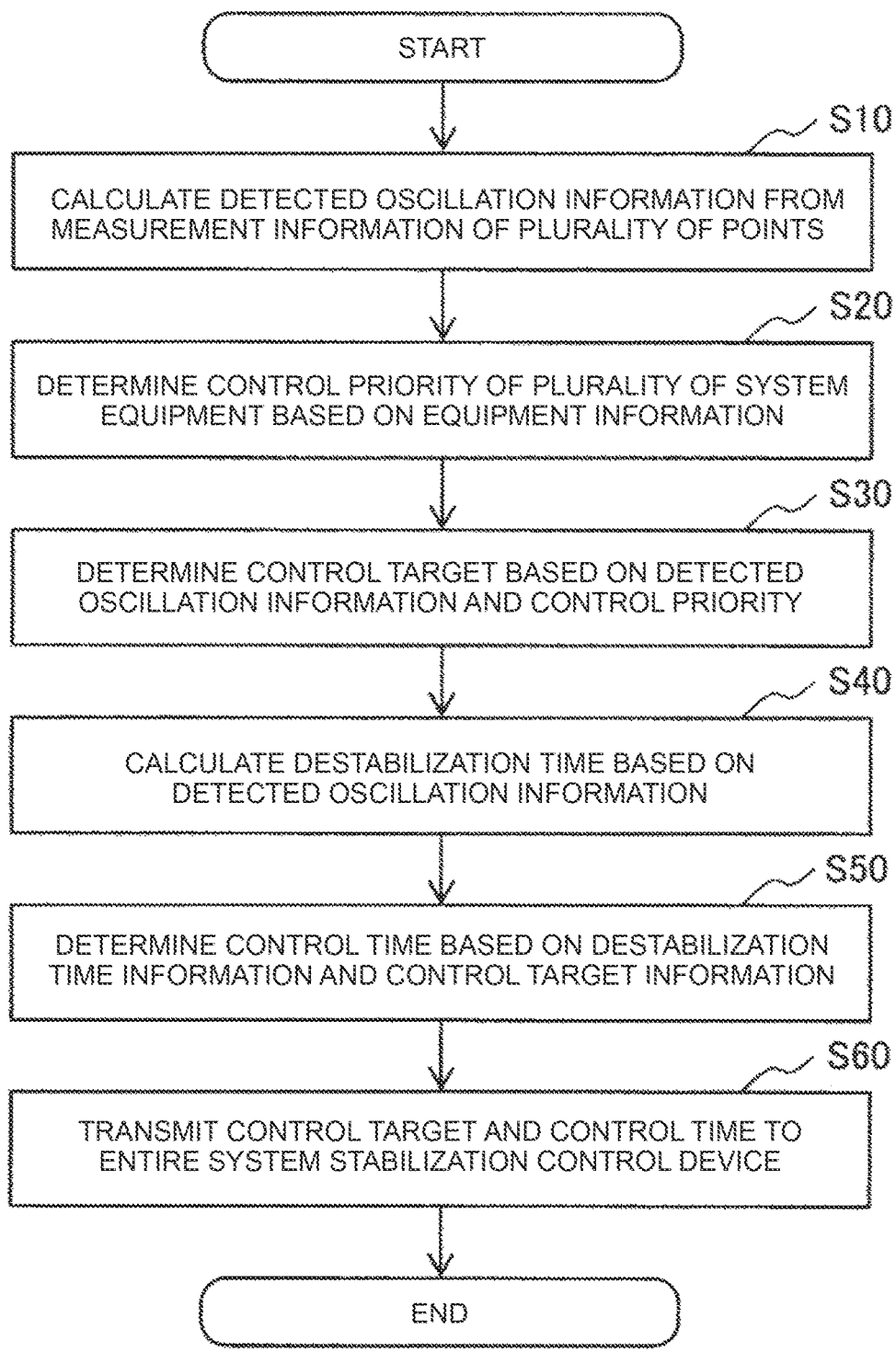
FIG. 25A is a diagram showing the processing flow in the system stabilization control device 200 according to Embodiment 3.
Figure 25B:
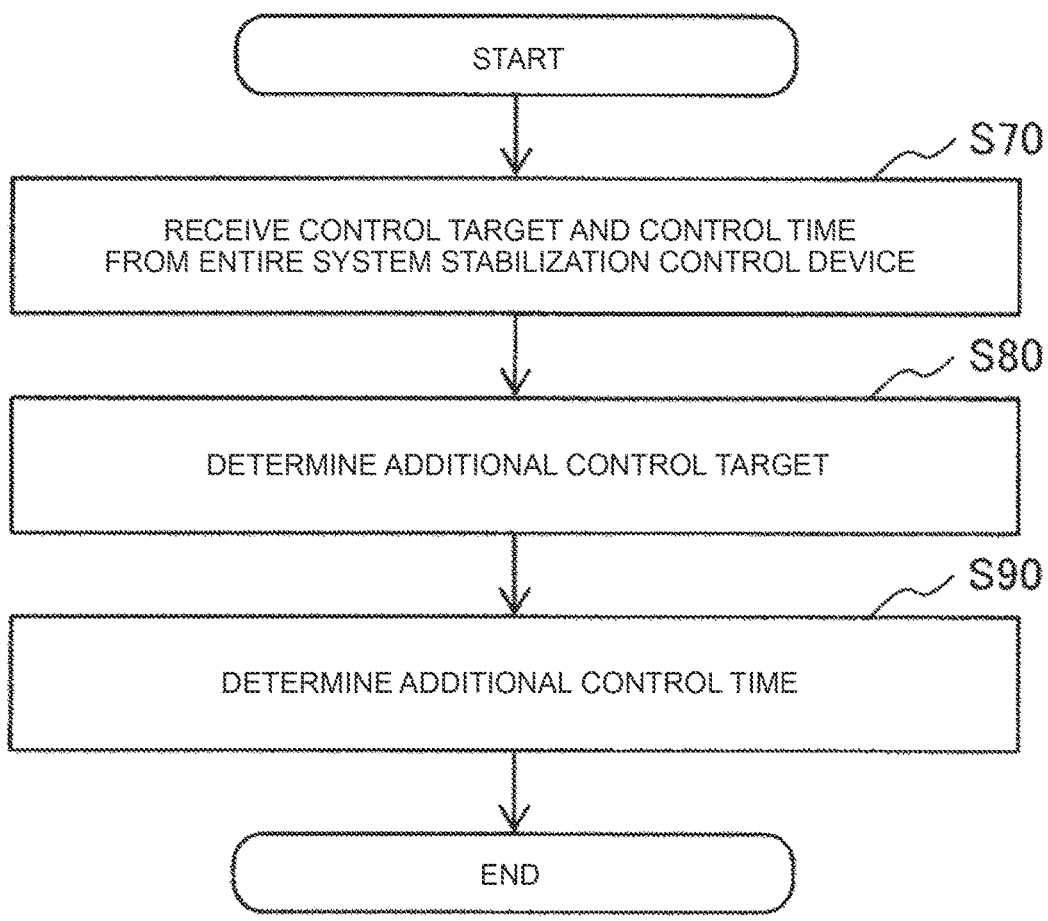
FIG. 25B is a diagram showing the processing flow in the entire system stabilization control device 300 according to Embodiment 3.

FIG. 25 shows the processing flow in the system stabilization control device 200 and the entire system stabilization control device 300. FIG. 25A is the processing flow in the system stabilization control device 200, and FIG. 25B is the processing flow in the entire system stabilization control device 300.

The processing flow of FIG. 25A is basically the same as the configuration of FIG. 3, and only differs with regard to the point of sending the control target and the control time to the entire system stabilization control device 300 in processing step S60 after the series of processing.

The processing flow of FIG. 25B is basically the same as the configuration of the system stabilization control addition determining unit 60 of FIG. 23, and differs with regard to the point that the control target and the control time are received from the entire system stabilization control device 300 in processing step S70 as the premise thereof.

Finally, the terms used for expressing the present invention are now explained. The system stabilization control device 200 or the like may be used as the system stabilization control device. The measurement device 20 or the like may be used as the measurement device. The storage device 206 or the like may be used as the storage unit. The communication means 203 or the like may be used as the reception unit. The system stabilization control determining unit 10 or the like may be used as the operation unit. The equipment information DB or the like may be used as the equipment information. The information communication network 108 or the like may be used as the communication line. The detected oscillation information or the like may be used as the oscillation information. The system stabilization control device 200 or the like may be used as the monitoring device.

REFERENCE SIGNS LIST

10: System stabilization control determining unit
11: Measurement information collection unit
12: Oscillation detection unit
13: Control priority determining unit
14: Control target determining unit
15: Destabilization time calculating unit
16: Control time determining unit
20: System measurement unit
21: Measurement device
30: Information storage unit
G: Generator
SS: Substation
C: Phase modifier
LD: Electric power load
PS: External power system
108: Information communication network
200: System stabilization control device

The invention claimed is:

1. A system stabilization control device for controlling a control instrument installed within a power system based on measurement information from a plurality of measurement points within the power system, comprising:
an equipment information database for storing information of system equipment that is interconnected with the power system;
a control priority determining unit for determining a control priority of the control instrument based on information of the system equipment;
a control target determining unit for determining a control target based on the measurement information from the plurality of measurement points and the control priority, wherein the control target determining unit determines the control target by using an electrical distance or impedance between the measurement points in which unstable oscillation was observed and the control instrument interconnected points;
a destabilization time calculating unit for calculating destabilization time of the power system from the measurement information from the plurality of measurement points; and
a control time determining unit for determining control time of the control instrument based on the destabilization time and the information of the system equipment, and
wherein the system stabilization control device controls the determined control instrument for the determined control time.

2. The system stabilization control device according to claim 1,
wherein the destabilization time calculating unit calculates the destabilization time by using at least one among oscillation frequency, attenuation coefficient and amplitude of a frequency component of oscillation of the power system.

3. The system stabilization control device according to claim 2,
wherein the information of the system equipment includes at least one among control means, controllable variable and operating time of the system equipment including the control instrument.

4. The system stabilization control device according to claim 3,
wherein the information of the system equipment includes at least one among latitude and longitude of each of the plurality of measurement points, topology between the plurality of measurement points, impedance between the plurality of measurement points, and characteristics of electric power equipment that is interconnected near each of the plurality of measurement points.

5. The system stabilization control device according to claim 4,
wherein the equipment information database stores past oscillation information, and
wherein the oscillation detection unit selects the past oscillation information corresponding to a status of the measurement point group, and calculates an oscillation influence based on a duration of the frequency component in the selected past oscillation information.

6. A system stabilization control device for controlling a control instrument installed within a power system based on measurement information from a plurality of measurement points within the power system, comprising:
an equipment information database for storing equipment information of system equipment including the control instrument that is interconnected with the power system;
a control priority determining unit for determining the control priority of the control instrument based on the equipment information;
a control target determining unit for determining the control instrument to be controlled according to a distance between oscillation measurement points of power system oscillation detected from the measurement information and the control instrument, and the priority;
a destabilization time calculating unit for calculating destabilization time of the power system oscillation detected from the measurement information; and
a control time determining unit for determining control time based on the destabilization time and the equipment information,
wherein the system stabilization control device controls the determined control instrument for the determined control time.

7. A power system control system for obtaining, in a system stabilization control device, measurement information from a plurality of measurement points within a power system via first communication means, and giving control instructions to a control instrument within system equipment configuring the power system from the system stabilization control device via second communication means, wherein the system stabilization control device comprises:
- an equipment information database for storing information of system equipment that is interconnected with the power system;
- a control priority determining unit for determining a control priority of the control instrument based on information of the system equipment;
- a control target determining unit for determining a control target based on measurement information from a plurality of measurement points and the control priority;
- a destabilization time calculating unit for calculating destabilization time of the power system from the measurement information from the plurality of measurement points;
- a control time determining unit for determining control time based on the destabilization time and the equipment information;
- an output unit for giving the control instructions including the determined control instrument and the determined control time via the second communication means;
- an anticipated oscillation calculating unit for calculating anticipated oscillation based on the equipment information; and
- an oscillation comparison unit for comparing the measurement information and the anticipated oscillation, and wherein the control target determining unit determines the control target based on the oscillation comparison result and the control priority.

8. The power system control system according to claim 7, further comprising:
- an entire system stabilization control device connected to the output unit of the system stabilization control device and for obtaining information including the determined control instrument and the determined control time, wherein the entire system stabilization control device comprises:
- an additional control determining unit for determining an additional control instrument and an additional control time based on a received control instrument and control time; and
- an output unit for sending the additional control instrument and the additional control time to the control instrument within the system equipment.

* * * * *